United States Patent
Tsai et al.

(10) Patent No.: US 9,871,534 B2
(45) Date of Patent: Jan. 16, 2018

(54) ANALOG-TO-DIGITAL CONVERTER WITH EMBEDDED NOISE-SHAPED TRUNCATION, EMBEDDED NOISE-SHAPED SEGMENTATION AND/OR EMBEDDED EXCESS LOOP DELAY COMPENSATION

(71) Applicant: MEDIATEK INC., Hsin-Chu (TW)

(72) Inventors: Jen-Huan Tsai, Hsinchu (TW); Chih-Hong Lou, Yilan County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/499,872

(22) Filed: Apr. 27, 2017

(65) Prior Publication Data
US 2017/0353192 A1 Dec. 7, 2017

Related U.S. Application Data

(60) Provisional application No. 62/345,013, filed on Jun. 3, 2016.

(51) Int. Cl.
*H03M 3/00* (2006.01)
*H03M 1/12* (2006.01)
*H03M 1/46* (2006.01)

(52) U.S. Cl.
CPC ......... *H03M 3/426* (2013.01); *H03M 1/1245* (2013.01); *H03M 1/466* (2013.01); *H03M 3/424* (2013.01)

(58) Field of Classification Search
None
See application file for complete search history.

(56) References Cited

U.S. PATENT DOCUMENTS

| | | | |
|---|---|---|---|
| 6,404,368 B1 | 6/2002 | Yamaguchi | |
| 7,362,247 B2* | 4/2008 | Arias | H03M 3/388 341/118 |
| 7,450,047 B1* | 11/2008 | Wu | H03M 3/412 341/143 |
| 7,522,079 B1* | 4/2009 | Wu | H03M 3/412 341/118 |

(Continued)

OTHER PUBLICATIONS

Wei, A 13-ENOB, 5 MHz BW, 3.16 mW Multi-Bit Continuous-Time Delta Sigma ADC in 28 nm CMOS with Excess-Loop-Delay Compensation Embedded in SAR Quantizer, 2015 Symposium on VLSI Circuits Digest of Technical Papers.

(Continued)

*Primary Examiner* — Howard Williams
(74) *Attorney, Agent, or Firm* — Winston Hsu

(57) ABSTRACT

An exemplary quantizer includes a multi-bit analog-to-digital converter (ADC) and a first digital-to-analog converter (DAC) feedback circuit. The multi-bit ADC has an internal DAC associated with comparison of each sampled analog input of the multi-bit ADC. The multi-bit ADC converts a currently-sampled analog input into a first digital output. A first noise-shaped truncation output is derived from the first digital output. The first DAC feedback circuit transfers a first truncation residue associated with the first noise-shaped truncation output to the internal DAC. The transferred first truncation residue is reflected in comparison of a later-sampled analog input of the multi-bit ADC via the internal DAC.

19 Claims, 26 Drawing Sheets

(56) References Cited

U.S. PATENT DOCUMENTS

| 7,525,464 B2* | 4/2009 | Maloberti | H03M 3/428 |
| | | | 341/143 |
| 8,344,921 B2* | 1/2013 | Lin | H03M 3/412 |
| | | | 341/143 |
| 9,385,740 B2 | 7/2016 | Wang | |
| 2011/0018753 A1 | 1/2011 | Lou | |

OTHER PUBLICATIONS

Wu, A 24.7mW 45MHz-BW 75.3dB-SNDR SAR-Assisted CT Delta Sigma Modulator with 2nd-Order Noise Coupling in 65nm CMOS, ISSCC 2016/ Session 15/ Oversampling Data Converters / 15.1, pp. 270-271 and a page including Figure 15.1.7.

Lin He et al., A Multibit Delta-Sigma Modulator With Double Noise-Shaped Segmentation, IEEE Transactions On Circuits and Systems-II: Express Briefs, vol. 62, No. 3, Mar. 2015, XP011574096, pp. 241-245.

Fang Long et al., A General Cascaded Noise-Coupled Architecture for ΔΣ Modulators with Segmented Quantization, IEEE, ICSICT2014, 2014, Guilin, China, XP032727415.

Jose Luis Ceballos et al., Some Techniques to Improve the Performance of Delta-Sigma Modulators, XP055414619, 2004.

* cited by examiner

ANALOG-TO-DIGITAL CONVERTER WITH EMBEDDED NOISE-SHAPED TRUNCATION, EMBEDDED NOISE-SHAPED SEGMENTATION AND/OR EMBEDDED EXCESS LOOP DELAY COMPENSATION

CROSS REFERENCE TO RELATED APPLICATIONS

This application claims the benefit of U.S. provisional application No. 62/345,013, filed on Jun. 3, 2016 and incorporated herein by reference.

BACKGROUND

The present invention relates to a quantizer design, and more particularly, to an analog-to-digital converter (ADC) with embedded noise-shaped truncation, embedded noise-shaped segmentation and/or embedded excess loop delay (ELD) compensation.

Analog techniques have dominated signal processing for years, but digital techniques are encroaching into this domain. An analog-to-digital converter (ADC) is needed to convert an analog signal into a digital signal, thus allowing the signal to be processed in a digital domain. The ADC may be used in a variety of applications. For example, a continuous-time delta-sigma modulator (CTDSM) has a quantizer implemented using an ADC. In general, a core part of the CTDSM is responsible for digitizing the analog input signal and reducing noise at lower frequencies. In this stage, the architecture implements a function called noise shaping that pushes low-frequency noise (e.g., quantization noise) up to higher frequencies outside the in-band (i.e., the band of interest).

To improve noise performance, reduce the power consumption and/or reduce the hardware complexity, several techniques have been proposed to add extra digital circuits to the CTDSM for applying additional digital processing to an ADC output (i.e., a quantizer output). However, the extra digital circuits introduce longer latency inevitably, thus resulting in a reduced excess loop delay (ELD) timing margin. As a result, these techniques are not applicable to a high-speed CTDSM with a stringent ELD timing margin requirement.

SUMMARY

One of the objectives of the claimed invention is to provide an analog-to-digital converter (ADC) with embedded noise-shaped truncation, embedded noise-shaped segmentation and/or embedded excess loop delay (ELD) compensation to solve the above-mentioned problems.

According to a first aspect of the present invention, an exemplary quantizer is disclosed. The exemplary quantizer includes a multi-bit analog-to-digital converter (ADC) and a first digital-to-analog converter (DAC) feedback circuit. The multi-bit ADC has an internal DAC associated with comparison of each sampled analog input of the multi-bit ADC. The multi-bit ADC converts a currently-sampled analog input into a first digital output, wherein a first noise-shaped truncation output is derived from the first digital output. The first DAC feedback circuit is configured to transfer a first truncation residue associated with the first noise-shaped truncation output to the internal DAC, wherein the transferred first truncation residue is reflected in comparison of a later-sampled analog input of the multi-bit ADC via the internal DAC.

According to a second aspect of the present invention, an exemplary quantizer is disclosed. The exemplary quantizer includes a multi-bit analog-to-digital converter (ADC), a digital-to-analog converter (DAC) feedback circuit and a first adder. The multi-bit ADC has an internal DAC associated with comparison of each sampled analog input of the multi-bit ADC, wherein the multi-bit ADC converts a currently-sampled analog input into a first digital output and further converts an earlier-sampled analog input into a second digital output, a first noise-shaped truncation output is derived from the first digital output, and a second noise-shaped truncation output is derived from the second digital output. The DAC feedback circuit is configured to transfer a first truncation residue associated with the first noise-shaped truncation output to the internal DAC and further transfer a second truncation residue associated with the second noise-shaped truncation output to the internal DAC, wherein the transferred second truncation residue is reflected in comparison of the currently-sampled analog input of the multi-bit ADC via the internal DAC, and the transferred first truncation residue is reflected in comparison of a later-sampled analog input of the multi-bit ADC via the internal DAC. The first adder is configured to subtract the second truncation residue from the first truncation residue to generate a third noise-shaped truncation output, wherein the first noise-shaped truncation output and the third noise-shaped truncation output are noise-shaped segmentation outputs of the currently-sampled analog input.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
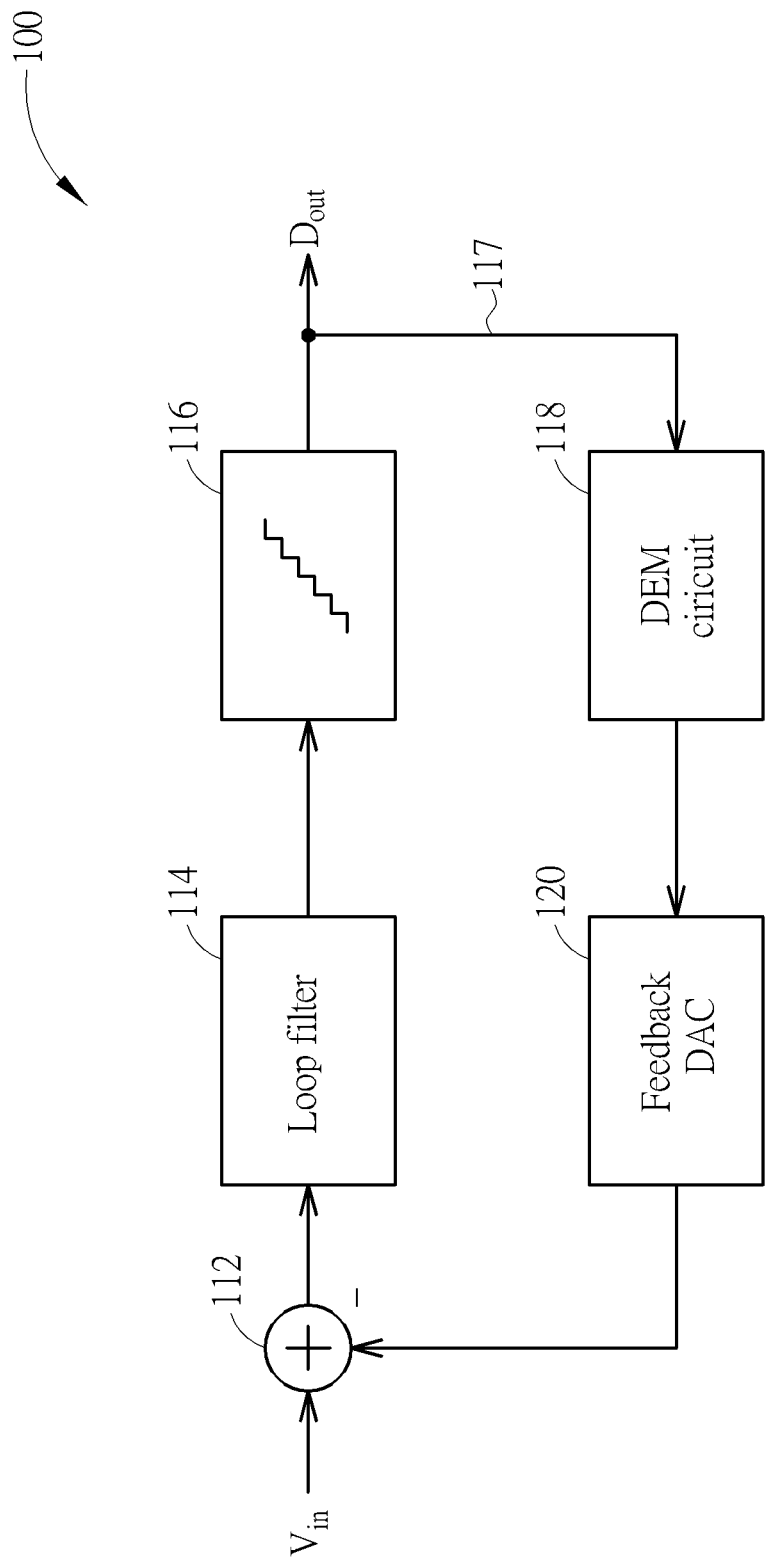
FIG. 1 is a diagram illustrating a continuous-time delta-sigma modulator (CTDSM) according to an embodiment of the present invention.

FIG. 1 is a diagram illustrating a continuous-time delta-sigma modulator (CTDSM) according to an embodiment of the present invention. The CTDSM 100 includes a combining circuit 112 (which may be implemented using an operational amplifier to perform analog signal subtraction), a loop filter 114 (which may include one or more integrators), a quantizer 116 (which may be implemented using an analog-to-digital converter (ADC)), a dynamic element matching (DEM) circuit 118 (which may employ a data weighted averaging (DWA) algorithm), and a feedback digital-to-analog converter (DAC) 120, where the DEM circuit 118 and the feedback DAC 120 are located at a feedback path 117 between an output node of the quantizer 116 and one input node of the combining circuit 112. The CTDSM 100 is configured for receiving an analog input $V_{in}$ and converting the analog input $V_{in}$ in an analog domain into a modulator output $D_{out}$ in a digital domain. In a case where the quantizer 116 is implemented using a multi-bit ADC, the feedback DAC 120 is required to be a multi-bit DAC having multiple DAC cells (not shown). The DEM circuit 118 can apply noise-shaping to mismatch of the DAC cells in the feedback DAC 120 to thereby improve linearity of the feedback DAC 120. A person skilled in the art should readily understand the operational principle of the CTDSM 100 shown in FIG. 1, further description is omitted here for brevity.

To relax the feedback DAC resolution and reduce the complexity of the DEM circuit 118 without introducing significant latency to the CTDSM loop, a quantizer using a multi-bit ADC with embedded noise-shaped truncation is disclosed. To relax the match requirement of DAC cells in the feedback DAC 120 without introducing significant latency to the CTDSM loop, a quantizer using a multi-bit ADC with embedded noise-shaped segmentation is disclosed. To achieve excess loop delay (ELD) compensation with a lower hardware cost and without suffering from the sampling instant disturbance issue encountered by a classical ELD compensation scheme, a quantizer using a multi-bit ADC with embedded ELD compensation is disclosed. Alternatively, a multi-bit ADC may employ two or all of the embedded noise-shaped truncation technique, the embedded noise-shaped segmentation technique and the embedded ELD compensation technique. For example, the quantizer 116 may be implemented using a multi-bit ADC with embedded noise-shaped truncation, a multi-bit ADC with embedded noise-shaped segmentation, a multi-bit ADC with embedded noise-shaped truncation and embedded noise-shaped segmentation, a multi-bit ADC with embedded noise-shaped truncation, embedded noise-shaped segmentation and embedded ELD compensation, a multi-bit ADC with embedded noise-shaped truncation and embedded ELD compensation, or a multi-bit ADC with embedded noise-shaped segmentation and embedded ELD compensation. Further details of the said quantizers are described as below.

Figure 2:
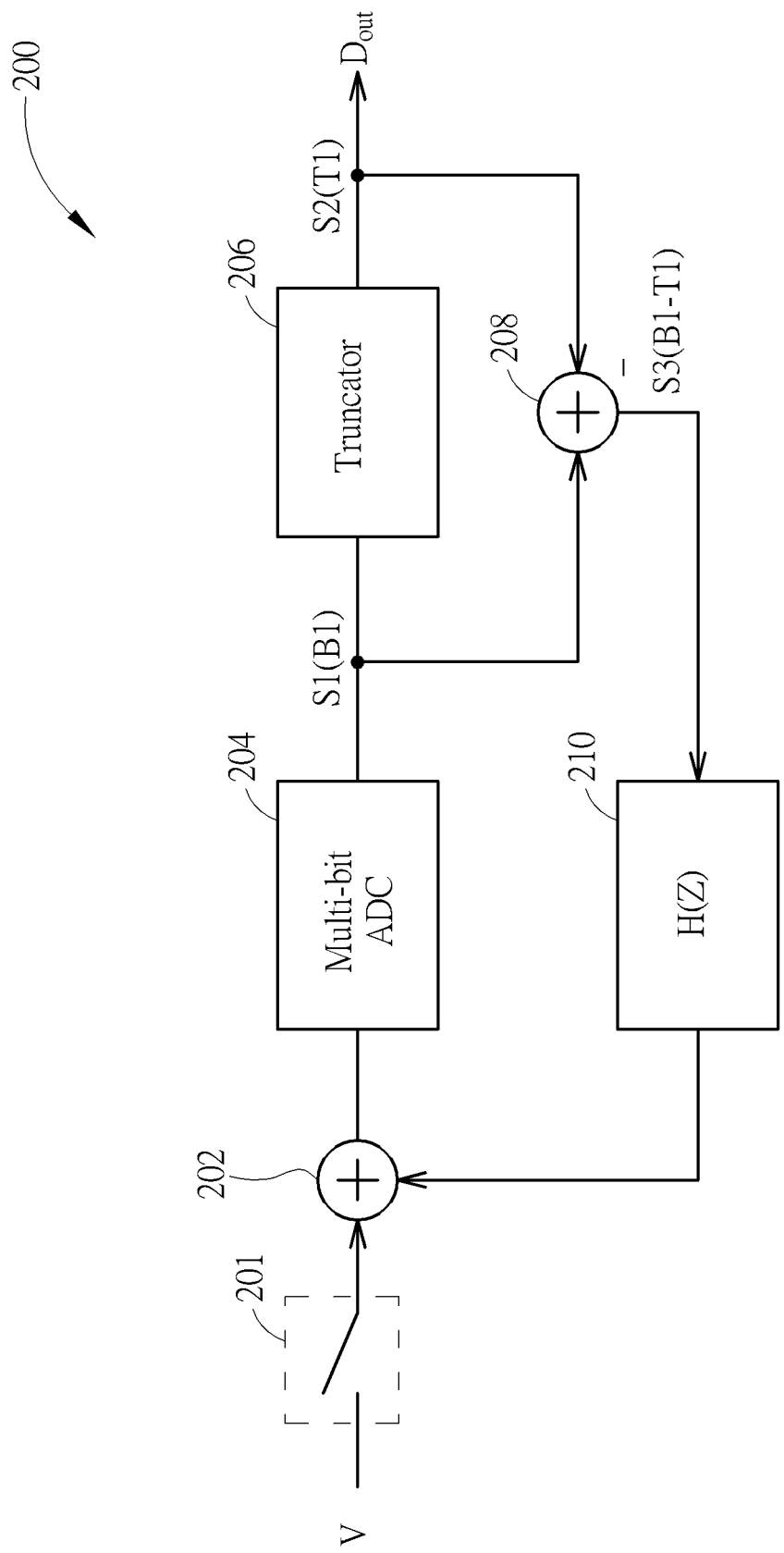
FIG. 2 is a diagram illustrating a quantizer using a multi-bit ADC with embedded noise-shaped truncation according to an embodiment of the present invention.

FIG. 2 is a diagram illustrating a quantizer using a multi-bit ADC with embedded noise-shaped truncation according to an embodiment of the present invention. The quantizer 200 includes a sample and hold circuit 201, a combining circuit 202 (which performs signal subtraction in the analog domain), a multi-bit ADC 204, a truncator 206, an adder 208 (which performs data subtraction in the digital domain), and a DAC feedback circuit 210 (which has a designated transfer function H(z)). The sample and hold circuit 201 is configured to sample an analog input V according to a sampling clock, and hold each sampled analog input to be processed by the following multi-bit ADC 204. For example, the sample and hold circuit 201 generates an earlier-sampled analog input, a currently-sampled analog input and a later-sampled analog input one by one. When the earlier-sampled analog input is obtained by the sample and hold circuit 201, the earlier-sampled analog input is processed by following circuits of the quantizer 200 before the currently-sampled analog input is obtained by the sample and hold circuit 201. Similarly, when the currently-sampled analog input is obtained by the sample and hold circuit 201, the currently-sampled analog input is processed by following circuits of the quantizer 200 before the later-sampled analog input is obtained by the sample and hold circuit 201.

The multi-bit ADC 204 is configured to convert each sampled analog input into a digital output S1 (B1 bits). The embedded noise-shaped truncation is achieved by a delta-sigma modulation scheme, where a noise-shaped truncation output S2 (T1 bits, where T1<B1) is derived from the digital output S1 through the truncator 206, and an associated truncation residue S3 ((B1−T1) bits) is obtained by the adder 208 and then fed back to the combining circuit 202 via the DAC feedback circuit 210, such that the transferred truncation residue H(z)·S3 associated with the noise-shaped truncation output S2 of a currently-sampled analog input (or an earlier-sampled analog input) is reflected in analog-to-digital conversion of a later-sampled analog input (or a currently-sampled analog input). When the quantizer 116 shown in FIG. 1 is implemented using the quantizer 200 shown in FIG. 2, the noise-shaped truncation output S2 may also serve as the modulator output $D_{out}$ that will be fed back via DEM circuit 118 and feedback DAC 120.

In one exemplary embodiment, the truncator 206 and the adder 208 may be simply implemented using signal traces, and the DAC feedback circuit 210 and the combining circuit 202 may be implemented using internal circuitry (e.g., an internal latch circuit and an internal DAC) of the multi-bit ADC 204 with no additional hardware cost. For example, the digital output S1 has a T1-bit most significant bit (MSB) part and a (B1−T1)-bit least significant bit (LSB) part, where the MSB part is transmitted by a group of T1 signal traces (which acts as the truncator 206) to directly serve as the noise-shaped truncation output S2, and the LSB part is transmitted by a group of (B1−T1) signal traces to directly serve as the associated truncation residue S3. In one exemplary design, the value of B1−T1 may be one. Hence, the LSB of the digital output S1 is directly used as the truncation residue S3.

In a case where the embedded noise-shaped truncation is achieved by a 1$^{st}$-order delta-sigma modulation, the transfer function H(z) may be $z^{-1}$, the (B1−T1)-bit LSB part of the digital output S1 is maintained by the internal latch circuit (which acts as the DAC feedback circuit 210) of the multi-bit ADC 204 when a later-sampled analog input is obtained by the sample and hold circuit 201, and the transferred truncation residue $z^{-1}$·S3 (which is associated with the noise-shaped truncation output S2 of the currently-sampled analog input and supplied from the internal latch circuit to the internal DAC of the multi-bit ADC 204) is reflected in comparison of the later-sampled analog input of the multi-bit ADC 204 via the internal DAC (which acts as the combining circuit 202). Since the error feedback summing is performed in the analog domain of the multi-bit ADC 204 by using the internal DAC of the multi-bit ADC 204, there is no need to use an additional combiner to perform the error feedback summing. In this way, the latency and the power consumption resulting from the additional combiner can be avoided.

Figure 3:
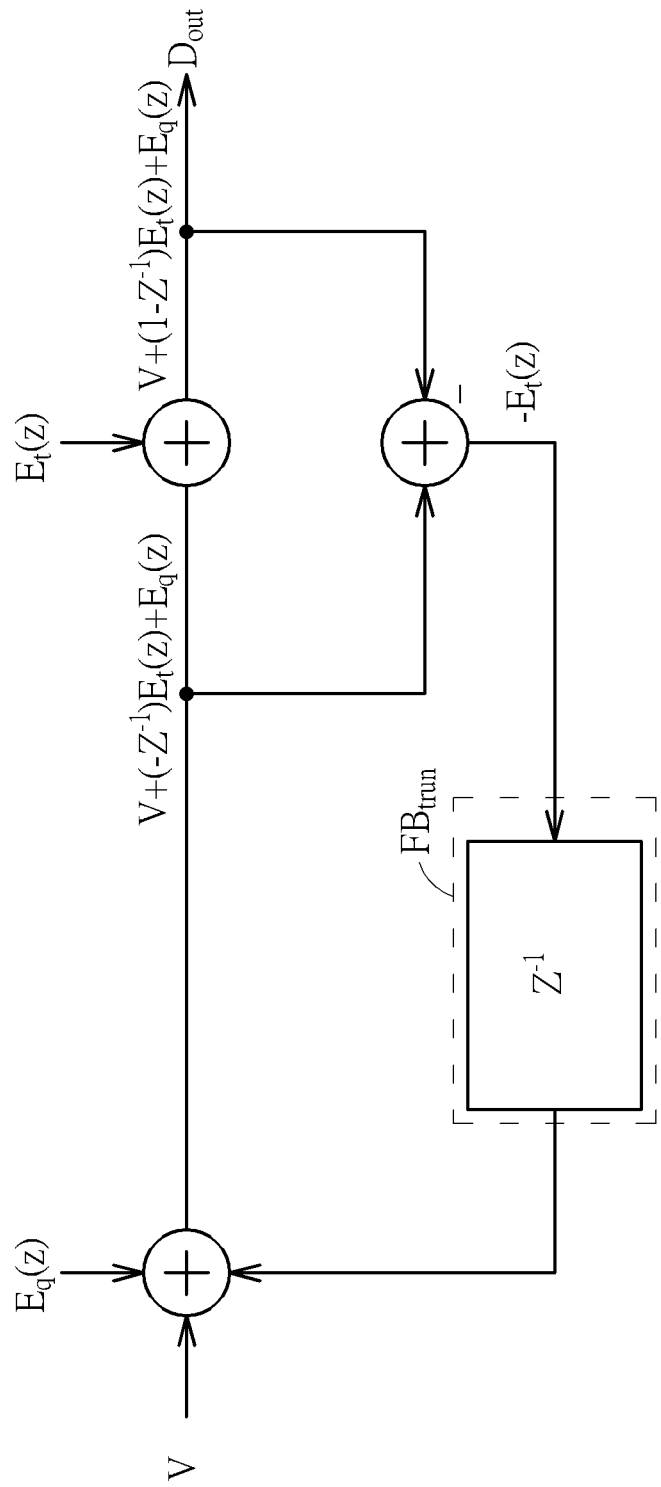
FIG. 3 is a diagram illustrating a z-domain model of the quantizer shown in FIG. 2 according to an embodiment of the present invention.

FIG. 3 is a diagram illustrating a z-domain model of the quantizer 200 shown in FIG. 2 according to an embodiment of the present invention. The quantization noise introduced by the multi-bit ADC 204 may be represented by $E_q(z)$, and the truncation noise introduced by the truncator 206 may be represented by $E_t(z)$. Assuming that the transfer function H(z) of the truncation error feedback $FB_{trun}$ (which is provided by DAC feedback circuit 210) is $z^{-1}$, the truncation noise added to the analog input V may be represented by $-E_t(z)·z^{-1}$. Hence, the digital output S1 may be represented by $V+(-z^{-1})E_t(z)+E_q(z)$, and the noise-shaped truncation output S2 (e.g., the modulator output $D_{out}$) may be represented by $V+(1-z^{-1})E_t(z)+E_q(z)$. In this embodiment, the noise transfer function (NTF) is 1−H(z), that is, $1-z^{-1}$. In this way, the truncation noise $E_t(z)$ is noise-shaped to the out-band. The z-domain model shown in FIG. 3 proves that the proposed quantizer design shown in FIG. 2 can achieve the desired noise-shaped truncation function by performing error feedback summing in the analog domain.

Figure 4:
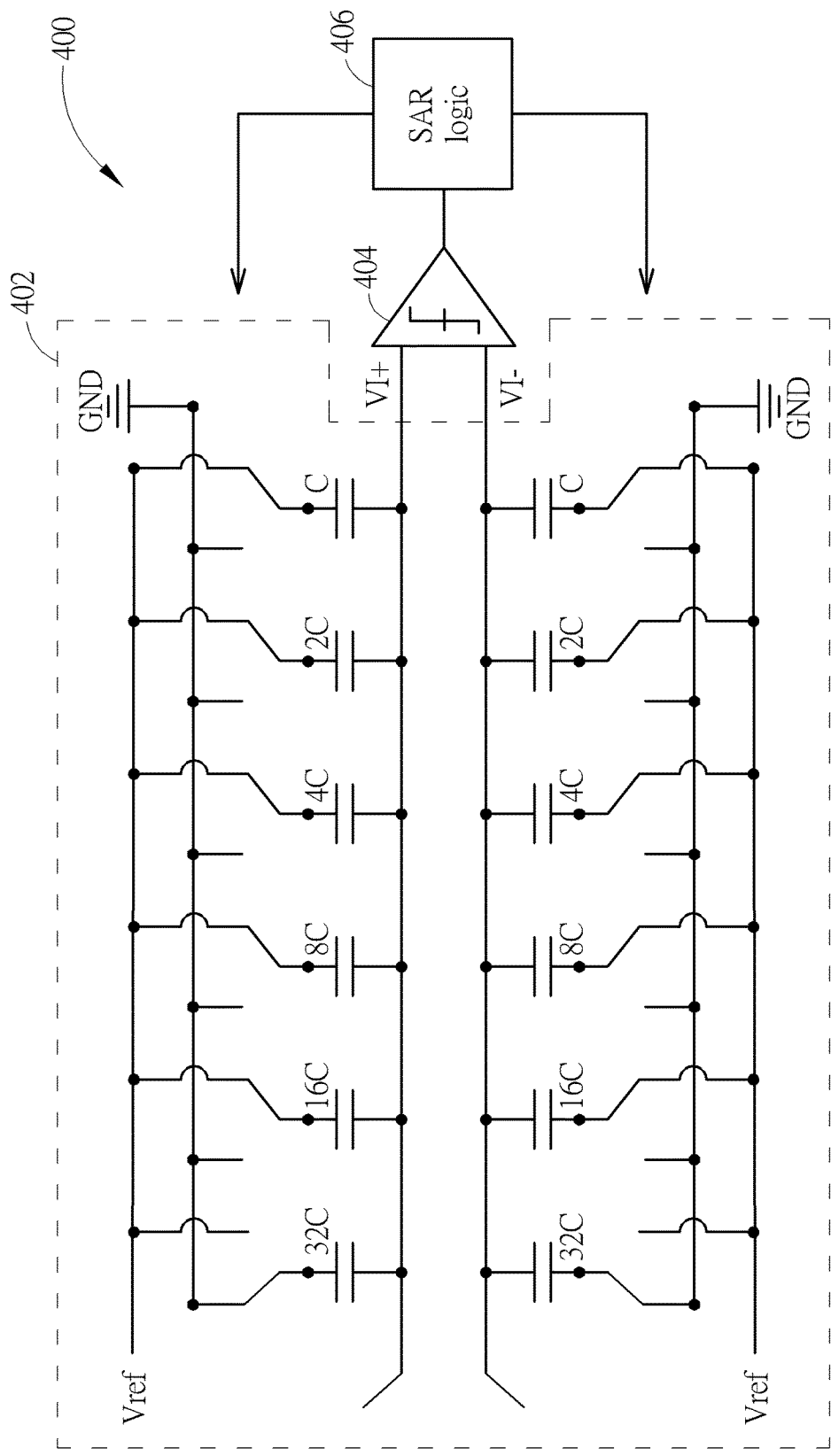
FIG. 4 is a diagram illustrating an SAR ADC with error feedback summing performed in an analog domain according to an embodiment of the present invention.
Figure 5:
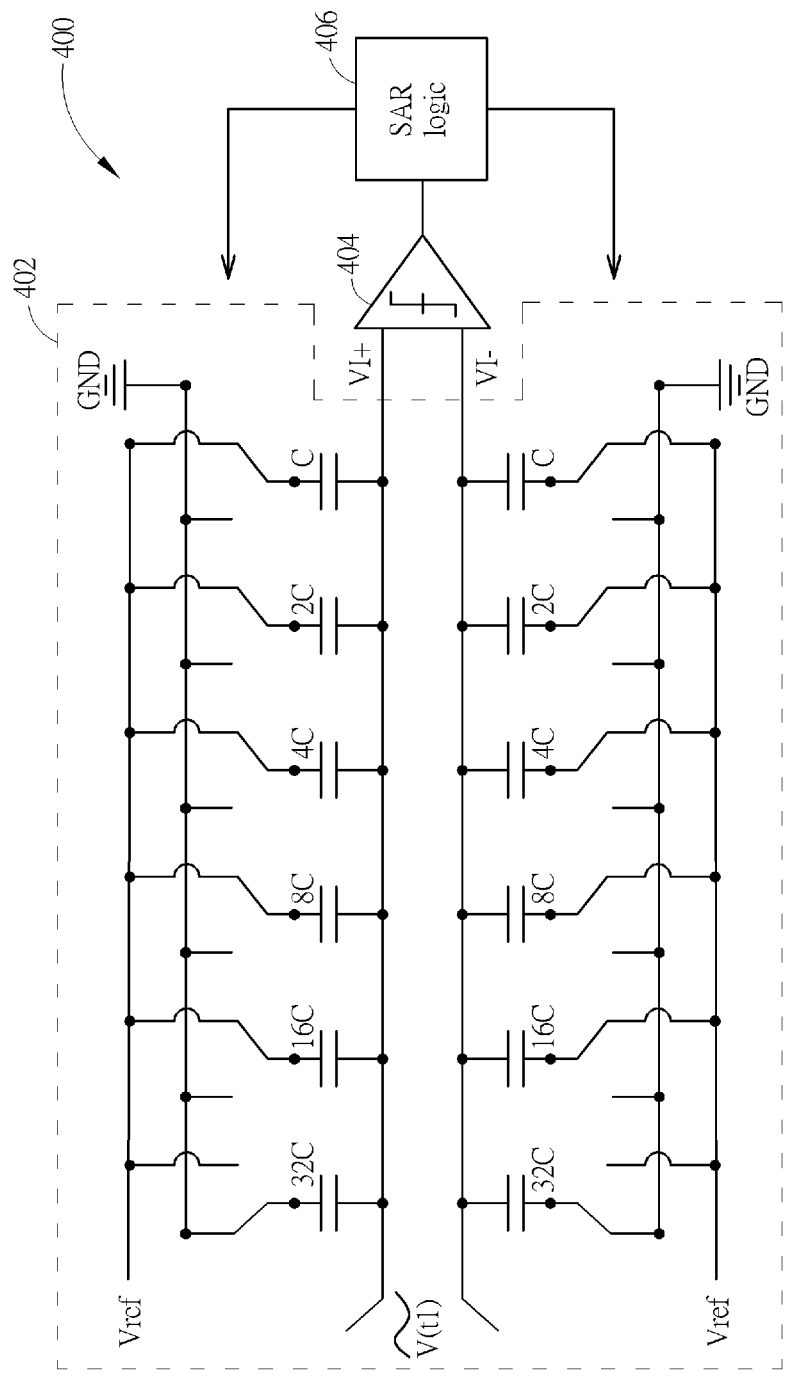
FIGS. 5-9 are diagrams illustrating the SAR ADC in FIG. 4 that is operated in different phases for achieving error feedback summing in the analog domain.

To achieve the embedded noise-shaped truncation, the multi-bit ADC 204 can be implemented using any ADC with an internal DAC. In one exemplary design, the multi-bit ADC 204 may be implemented by a successive approximation register (SAR) ADC. FIG. 4 is a diagram illustrating an SAR ADC with error feedback summing performed in an analog domain according to an embodiment of the present invention. The SAR ADC 400 includes an internal DAC 402, a comparator 404, and an SAR logic 406. As shown in FIG. 4, the internal DAC 402 of the SAR ADC 400 is a capacitor DAC having a plurality of binary-weighted capacitors. However, this is for illustrative purposes only, and is not meant to be a limitation of the present invention. Alternatively, the internal DAC 402 of the SAR ADC 400 may be implemented using a capacitor DAC having a plurality of non-binary weighted capacitors. In this embodiment, the SAR ADC 400 is a 6-bit SAR ADC having 6 binary-weighted top capacitors 32C, 16C, 8C, 4C, 2C and C, each having a top plate coupled to the positive input node of the comparator 404 and having 6 binary-weighted bottom capacitors 32C, 16C, 8C, 4C, 2C and C, each having a top plate coupled to the negative input node of the comparator 404. The capacitors 32C are the most significant bit (MSB) capacitors, and the capacitors C are the least significant bit (LSB) capacitors. Initially, the internal DAC 402 is reset by connecting bottom plates of MSB capacitors 32C to the ground voltage GND and connecting bottom plates of remaining capacitors 16C, 8C, 4C, 2C, C to the reference voltage $V_{ref}$, as illustrated in FIG. 4. After the internal DAC 402 is initialized/reset, a sampled analog input V(t1) generated at a sampling time t1 is supplied to top plates of top capacitors and bottom capacitors 32C, 16C, 8C, 4C, 2C, C, as illustrated in FIG. 5.

Next, the SAR logic 406 and the comparator 404 start the process of determining a 6-bit digital output from the MSB to the LSB one by one. For example, the comparator 404 performs a first comparison upon input voltages VI+ and VI− to generate a comparison result to the SAR logic 406. The SAR logic 406 refers to the comparison result of the first comparison to determine the MSB of the 6-bit digital output, and also refers to the comparison result of the first comparison to control switching of the capacitors 32C. For example, when the input voltage VI+ is higher than the input voltage VI−, a bottom plate of the bottom capacitor 32C is switched from the ground voltage GND to the reference voltage $V_{ref}$;

and when the input voltage VI− is higher than the input voltage VI+, a bottom plate of the top capacitor 32C is switched from the ground voltage GND to the reference voltage $V_{ref}$. After the first comparison and the associated capacitor switching are done, the comparator 404 performs a second comparison upon input voltages VI+ and VI− to generate a comparison result to the SAR logic 406. The SAR logic 406 refers to the comparison result of the second comparison to determine the next bit of the 6-bit digital output, and also refers to the comparison result of the second comparison to control switching of the capacitors 16C. For example, when the input voltage VI+ is higher than the input voltage VI−, a bottom plate of the top capacitor 16C is switched from the reference voltage $V_{ref}$ to the ground voltage GND; and when the input voltage VI− is higher than the input voltage VI+, a bottom plate of the bottom capacitor 16C is switched from the reference voltage $V_{ref}$ to the ground voltage GND. After the second comparison and the associated capacitor switching are done, the comparator 404 performs a third comparison, a fourth comparison, a fifth comparison and a sixth comparison upon input voltages VI+ and VI−, successively, and generates corresponding comparison results to the SAR logic 406, successively. The SAR logic 406 refers to the comparison results of the third comparison, the fourth comparison, the fifth comparison and the sixth comparison to determine the remaining bits of the 6-bit digital output, and also refers to the comparison results of the third comparison, the fourth comparison, the fifth comparison and the sixth comparison to control switching of the capacitors 8C, 4C, 2C and C. The switching rule of each of capacitors 8C, 4C, 2C and C is same as that of the capacitor 16C.

Figure 6:
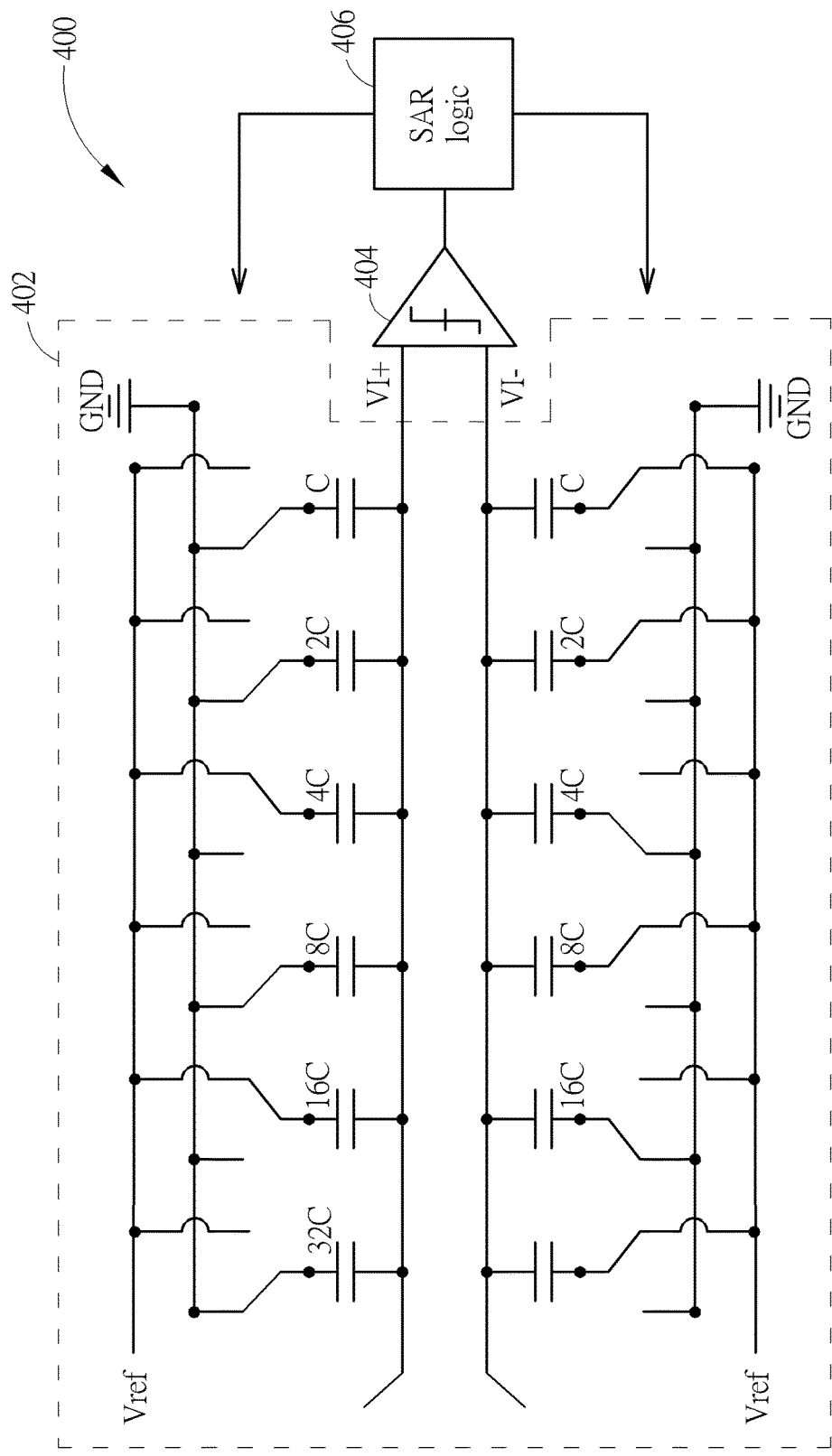

FIG. 6 shows a status of the internal DAC 402 after analog-to-digital conversion of the sampled analog input V(t1) is completed. In this example, the result of the first comparison makes the bottom plate of the bottom capacitor 32C switched from the ground voltage GND to the reference voltage $V_{ref}$, the result of the second comparison makes the bottom plate of the bottom capacitor 16C switched from the reference voltage $V_{ref}$ to the ground voltage GND, the result of the third comparison makes the bottom plate of the top capacitor 8C switched from the reference voltage $V_{ref}$ to the ground voltage GND, the result of the fourth comparison makes the bottom plate of the bottom capacitor 4C switched from the reference voltage $V_{ref}$ to the ground voltage GND, the result of the fifth comparison makes the bottom plate of the top capacitor 2C switched from the reference voltage $V_{ref}$ to the ground voltage GND, and the result of the sixth comparison makes the bottom plate of the top capacitor C switched from the reference voltage $V_{ref}$ to the ground voltage GND. Each of the comparisons determines one bit of the 6-bit digital output of the currently-sampled analog input V(t1). Hence, after the sixth comparison is completed, the 6-bit digital output of the currently-sampled analog input V(t1) is stored in an internal latch circuit of the SAR logic 406.

Figure 7:
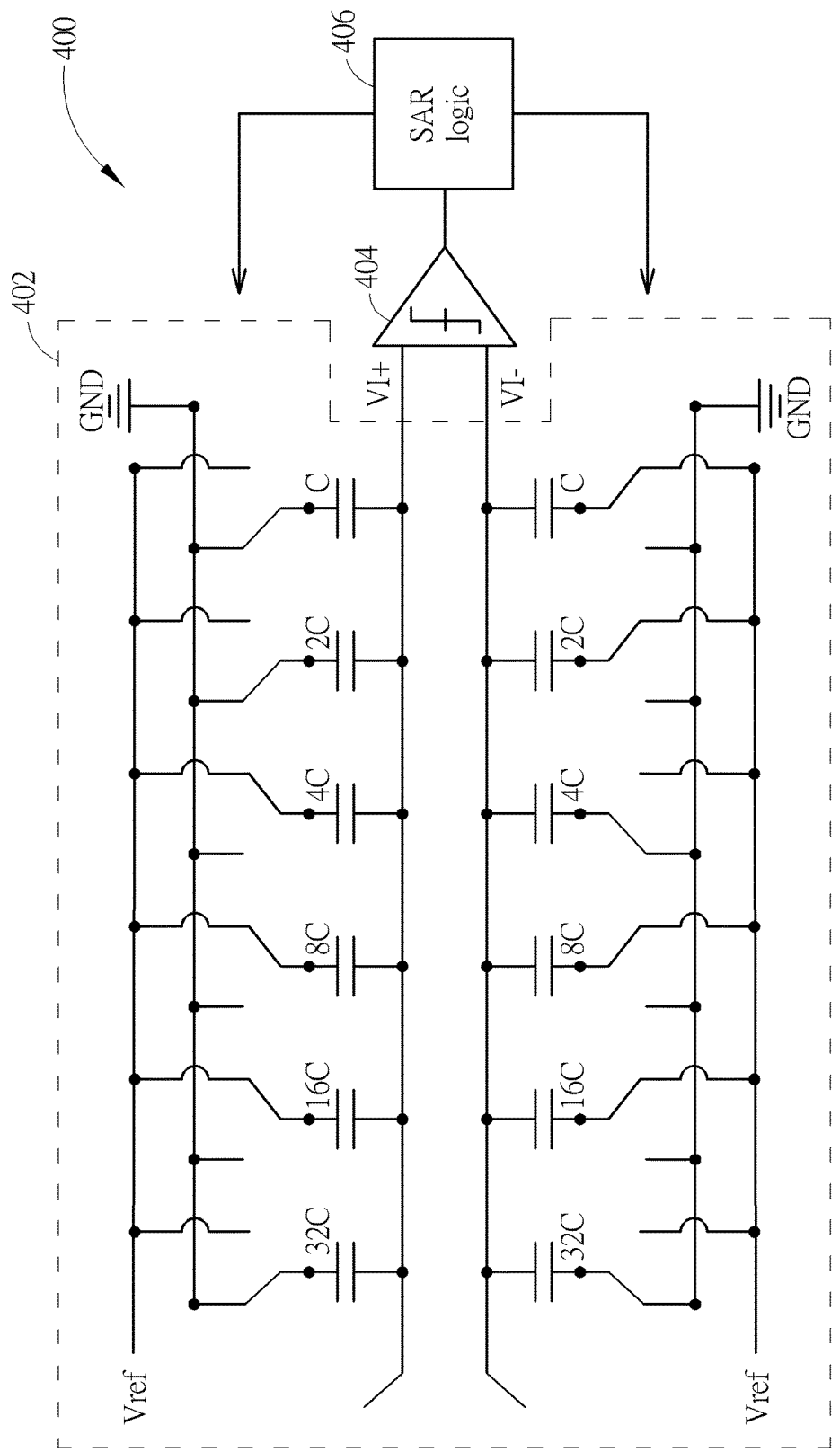

After the 6-bit digital output of the currently-sampled analog input V(t1) is determined by the SAR logic 406, the internal DAC 402 is reset for analog-to-digital conversion of a later-sampled analog input V (t2) generated at a sampling time t2. Assume that the truncation residue has 3 bits (e.g., B1−T1=3), and the transfer function of the truncation residue feedback is $z^{-1}$. When the internal DAC 402 is reset, only the first three bits are reset by the SAR logic 406, and the remaining three bits are kept (e.g., latched) by the SAR logic 406. That is, the 6-bit digital output of the currently-sampled analog input V(t1) may be composed of a 3-bit MSB part and a 3-bit LSB part, where the 3-bit MSB part is reset before the later-sampled analog input V(t2) is generated, and the 3-bit LSB part is kept/latched when the later-sampled analog input V(t2) is generated. As shown in FIG. 7, connections of bottom plates of top capacitors 32C, 16C, 8C and bottom plates of bottom capacitors 32C, 16C, 8C are reset to initial states.

Figure 8:
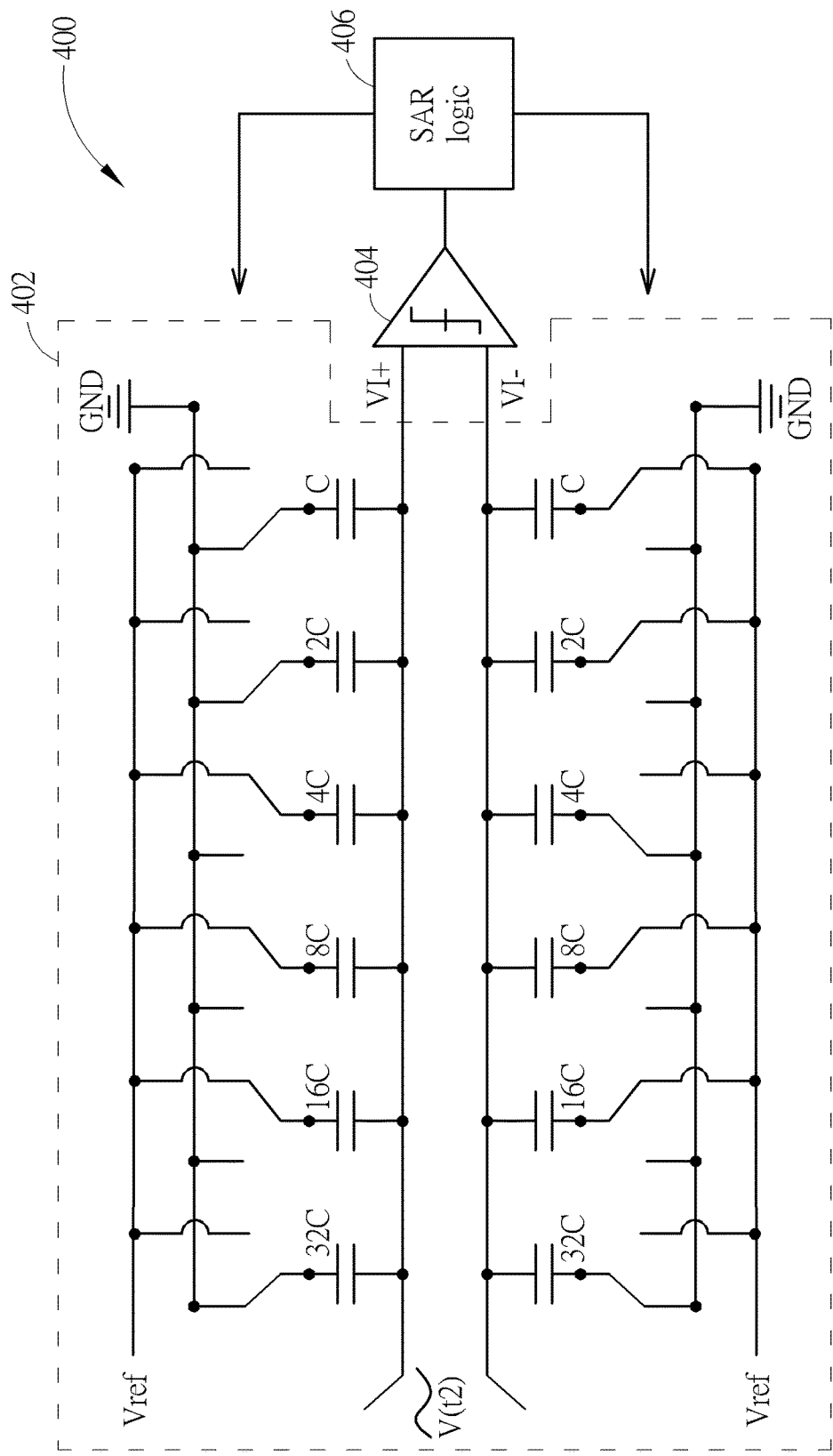
Figure 9:
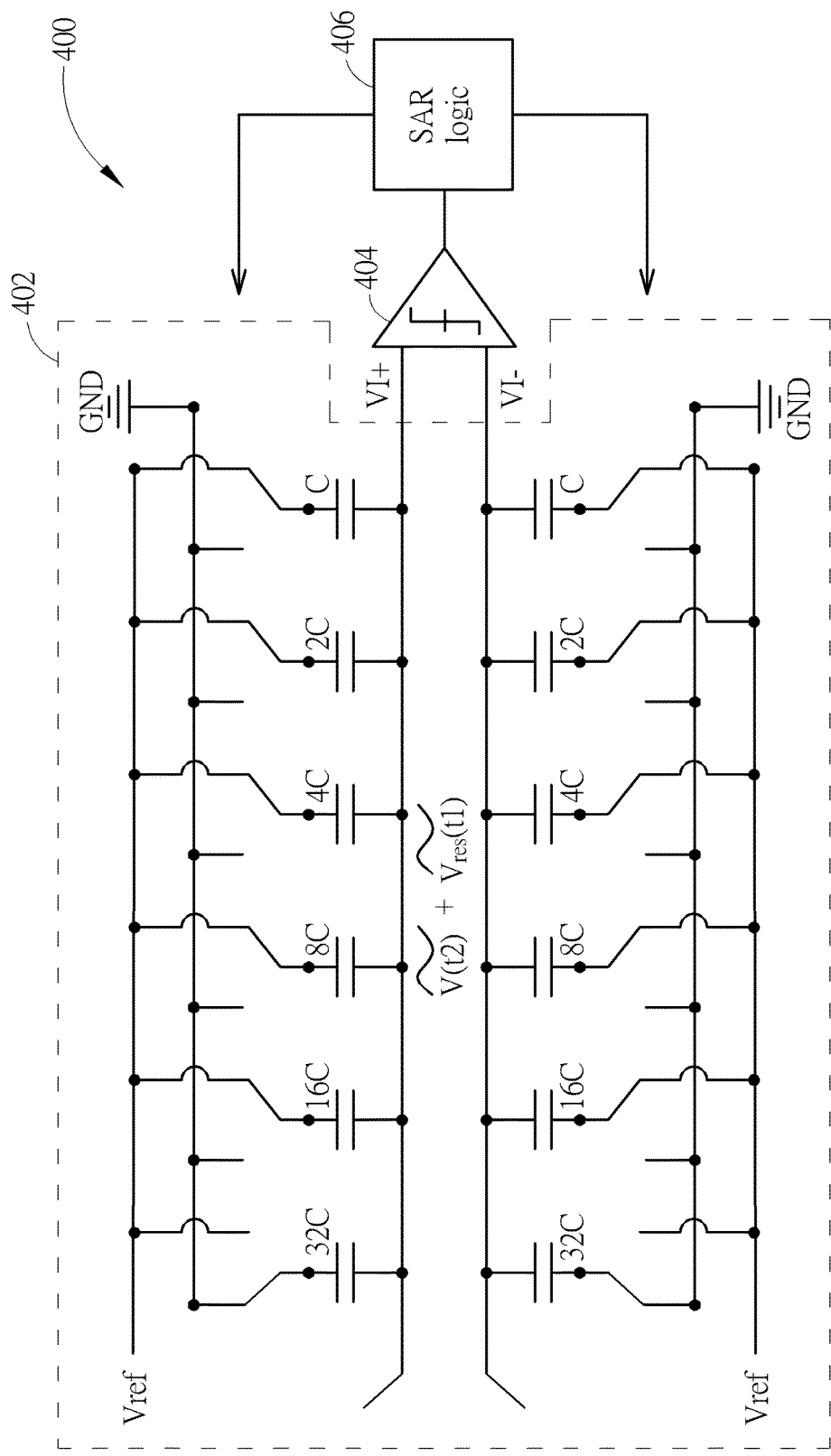

Next, the sampled analog input V(t2) generated at the sampling time t2 (t2 is later than t1) is supplied to top plates of top capacitors and bottom capacitors 32C, 16C, 8C, 4C, 2C, C, as shown in FIG. 8. After the sampled analog input V(t2) is sampled by the top capacitors and bottom capacitors 32C, 16C, 8C, 4C, 2C, C, the above-mentioned 3-bit LSB part kept/latched in the SAR logic 406 is reset, such that connections of bottom plates of top capacitors 4C, 2C, C and bottom plates of bottom capacitors 4C, 2C, 10 are reset to initial states, as shown in FIG. 9. In this way, the truncation residue $V_{res}(t1)$ associated with the currently-sampled analog input V(t2) is added to the later-sampled analog input V(t2) in the analog domain via the internal DAC 402 of the SAR ADC 400. Next, the combination result $V(t2)+V_{res}(t1)$ is converted into a 6-bit digital output by the SAR ADC 400.

Figure 10:
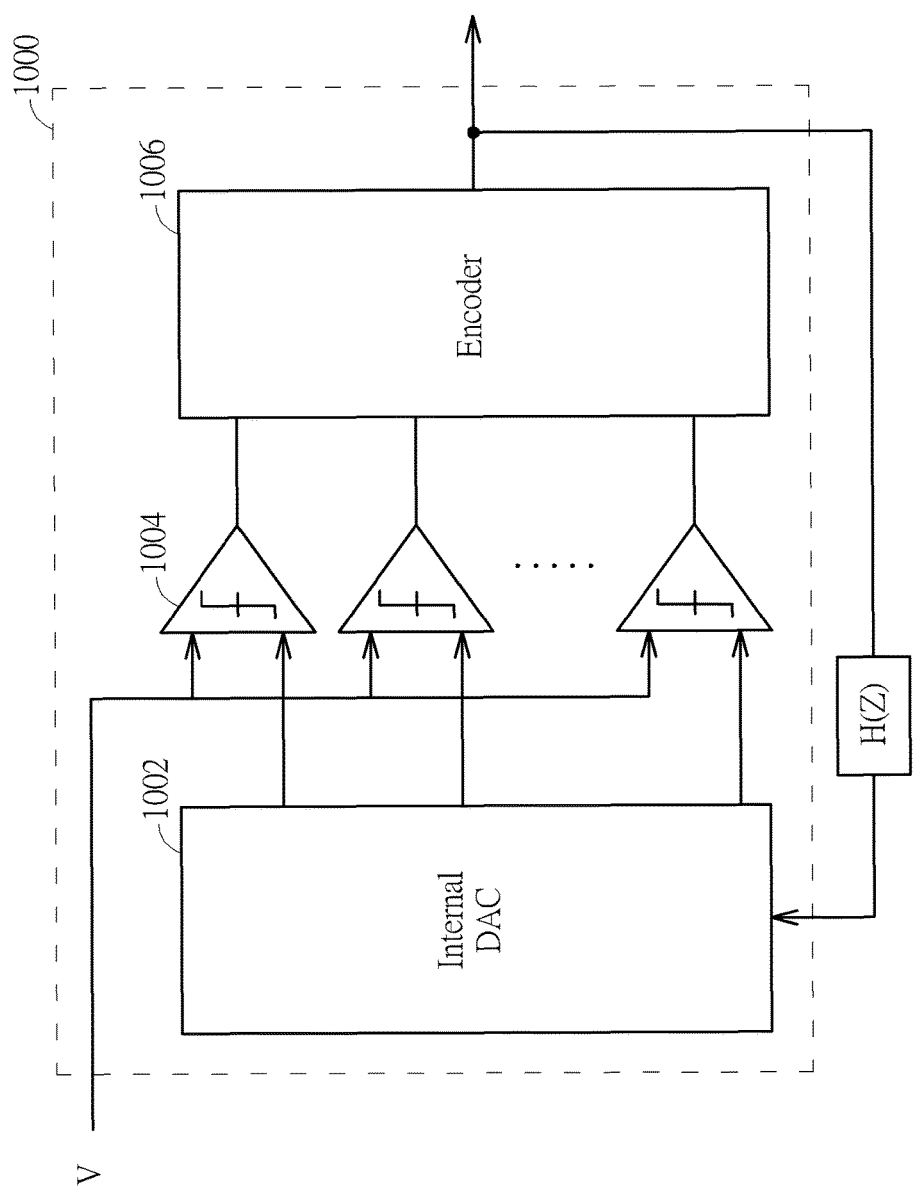
FIG. 10 is a diagram illustrating a flash ADC with error feedback summing performed in an analog domain according to an embodiment of the present invention.

In another exemplary design, the multi-bit ADC 204 may be implemented by a flash ADC. FIG. 10 is a diagram illustrating a flash ADC with error feedback summing performed in an analog domain according to an embodiment of the present invention. The flash ADC 1000 includes an internal DAC 1002, a plurality of comparators 1004, and an encoder 1006. The internal DAC 1002 is configured to provide different reference voltages used by the comparators 1004 for voltage level comparison, respectively. For example, the internal DAC 1002 may be implemented using a resistor DAC (R DAC), a capacitor DAC (C DAC), a resistor-capacitor DAC (R-C DAC), or an offset DAC. The comparators 1004 are configured to compare the same sampled analog input V with different reference voltages to generate a thermometer code to the encoder 1006, and the encoder 1006 is configured to convert the thermometer code into a binary code that acts as a digital output of the sampled analog input V. The digital output may be stored by an internal latch circuit of the encoder 1006. Assume that the encoder 1006 of the flash DAC 1000 is configured to generate a 6-bit digital output, the truncation residue has 3 bits (e.g., B1−T1=3), and the transfer function of the truncation residue feedback is $z^{-1}$. After the 6-bit digital output of a currently-sampled analog input is determined by the encoder 1006, the 3-bit LSB part of the 6-bit digital output is kept/latched and then fed back to the internal DAC 1002 for shifting the reference voltages used by the analog-to-digital conversion of a later-sampled analog input. It should be noted that adjusting the reference voltages used by the comparators 1004 without adjusting a voltage level of the sampled analog input fed into the comparators 1004 is equivalent to adjusting the voltage level of the sampled analog input fed into the comparators 1004 without adjusting the reference voltages used by the comparators 1004. Hence, the truncation residue associated with the currently-sampled analog input is added to the later-sampled analog input in the analog domain via the internal DAC 1002 of the flash ADC 1000.

When the multi-bit ADC 204 shown in FIG. 2 is implemented using the SAR ADC 400 shown in FIG. 4 or the flash ADC 1000 shown in FIG. 10, the truncation error feedback summing can be performed in the analog domain, thereby achieving the embedded noise-shaped truncation. In this way, the SAR ADC/flash ADC with embedded noise-shaped truncation can have lower hardware complexity when compared to the conventional noise-shaped truncation design.

Moreover, when the multi-bit ADC 204 shown in FIG. 2 is implemented using the SAR ADC 400 shown in FIG. 4, an MSB part of a digital output may be directly used as a noise-shaped truncation output, and an LSB part of the digital output may be directly used as a truncation residue associated with the noise-shaped truncation output. Hence, the DEM circuit 118 and the feedback DAC 120 of the CTDSM 100 can start processing the noise-shaped truncation output (e.g., the MSB part of the digital output) when the noise-shaped truncation output (e.g., the MSB part of the digital output) is available. In other word, since the SAR ADC 400 determines bits of the MSB part and the LSB part sequentially, the DEM circuit 118 and the feedback DAC 120 of the CTDSM 100 can process the noise-shaped truncation output (e.g., the MSB part of the digital output) while the SAR ADC 400 is determining the truncation residue (e.g., the LSB part of the digital output). In this way, the SAR ADC with embedded noise-shaped truncation can have lower latency when compared to the conventional noise-shaped truncation design.

Figure 11:
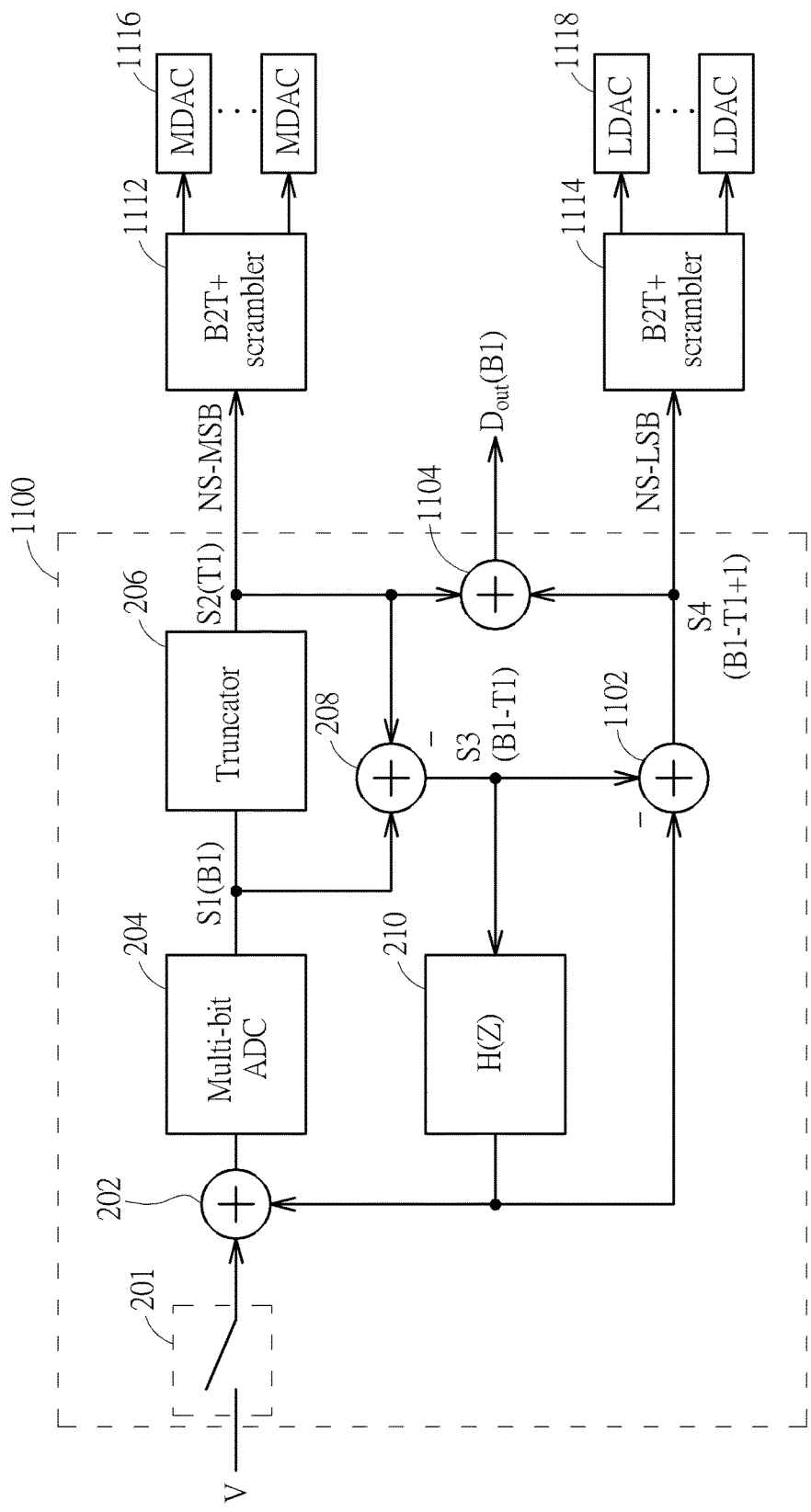
FIG. 11 is a diagram illustrating a quantizer using a multi-bit ADC with embedded noise-shaped segmentation according to an embodiment of the present invention.

FIG. 11 is a diagram illustrating a quantizer using a multi-bit ADC with embedded noise-shaped segmentation according to an embodiment of the present invention. The quantizer 1100 shown in FIG. 11 may be built based on the quantizer 200 shown in FIG. 2. For example, the noise-shaped truncation output S2 of a currently-sampled analog input may serve as one noise-shaped segmentation output NS-MSB, and an adder 1102 may be added to the quantizer 200 for determining another noise-shaped segmentation output NS-LSB of the currently-sampled analog input by a noise-shaped truncation output S4 (B1−T1+1 bits) with one bit overlapped with the noise-shaped truncation output S2 (T1 bits), wherein the noise-shaped truncation output S4 of the currently-sampled analog input is obtained by subtracting a transferred truncation residue H(z)·S3 associated with a noise-shaped truncation output S2 of an earlier-sampled analog input from a truncation residue S3 associated with the noise-shaped truncation output S2 of the currently-sampled analog input.

It should be noted that, when the earlier-sampled analog input is generated by the sample and hold circuit 201, the multi-bit ADC 204 converts the earlier-sampled analog input into a digital output S1, where a noise-shaped truncation output S2 and an associated truncation residue S3 are derived from the digital output S1 of the earlier-sampled analog input, and a noise-shaped truncation output S4 is derived from the truncation residue S3 of the earlier-sampled analog input and a transferred truncation residue H(z)·S3 provided by the DAC feedback circuit 210 according to a truncation residue S3 that is obtained before the earlier-sampled analog input is generated. In addition, the DAC feedback circuit 210 transfers the truncation residue S3 associated with the noise-shaped truncation output S2 of the earlier-sampled analog input to the internal DAC of the multi-bit ADC 204, such that segmentation error feedback summing (i.e., truncation error feedback summing) is performed in the analog domain and reflected in comparison/analog-to-digital conversion of a currently-sampled analog input. When the currently-sampled analog input is generated by the sample and hold circuit 201, the multi-bit ADC 204 converts the currently-sampled analog input into a digital output S1, where a noise-shaped truncation output S2 and an associated truncation residue S3 are derived from the digital output S1 of the currently-sampled analog input, and a noise-shaped truncation output S4 is derived from the truncation residue S3 of the currently-sampled analog input and a transferred truncation residue H(z)·S3 provided by the DAC feedback circuit 210 according to a truncation residue S3 obtained from the earlier-sampled analog input. In addition, the DAC feedback circuit 210 transfers the truncation residue S3 associated with the noise-shaped truncation output S2 of the currently-sampled analog input to the internal DAC of the multi-bit ADC 204, such that segmentation error feedback summing (i.e., truncation error feedback summing) is performed in the analog domain and reflected in comparison/analog-to-digital conversion of a later-sampled analog input.

Since the segmentation error feedback summing is performed in the analog domain of the multi-bit ADC 204 by using the internal DAC of the multi-bit ADC 204, there is no need to use an additional combiner to perform the segmentation error feedback summing. In this way, the latency and the power consumption resulting from the additional combiner can be avoided.

As shown in FIG. 11, one noise-shaped segmentation output NS-MSB is processed by a binary-to-thermometer converter and a scrambler (collectively denoted by "B2T+scrambler") 1112, and then the resulting scrambled bits are transmitted to MSB DAC cells (denoted by "MDACs") 1116, respectively; and another noise-shaped segmentation output (e.g., NS-LSB) is processed by a binary-to-thermometer converter and a scrambler (collectively denoted by "B2T+scrambler") 1114, and then the resulting scrambled bits are transmitted to LSB DAC cells (denoted by "LDACs") 1118, respectively. When the quantizer 116 shown in FIG. 1 is implemented using the quantizer 1100 shown in FIG. 11, the binary-to-thermometer converters and scramblers 1112 and 114 are included in the DEM circuit 118 that employs a DWA algorithm, and the MSB DAC cells 1116 and LSB DAC cells 1118 are included in the feedback DAC 120. The gain mismatch between MSB DAC cells 1116 and LSB DAC cells 1118 is shaped to the out-band due to noise-shaped segmentation applied to the digital output S1.

In one exemplary embodiment, the truncator 206 and the adder 208 may be simply implemented using signal traces, and the DAC feedback circuit 210 and the combining circuit 202 may be implemented using internal circuitry (e.g., an internal latch circuit and an internal DAC) of the multi-bit ADC 204 with no additional hardware cost. For example, the digital output S1 has a T1-bit most significant bit (MSB) part and a (B1−T1)-bit least significant bit (LSB) part, where the MSB part is transmitted by a group of T1 signal traces (which acts as the truncator 206) to directly serve as the noise-shaped truncation output S2/noise-shaped segmentation output NS-MSB, and the LSB part is transmitted by a group of (B1−T1) signal traces to directly serve as the associated truncation residue S3. In one exemplary design, the value of B1−T1 may be one. Hence, the LSB of the digital output S1 is directly used as the truncation residue S3, the binary-to-thermometer converter and scrambler 1114 can be omitted, and only one LDAC 1118 is needed. In this way, a fast path with no DWA is used.

Moreover, when the multi-bit ADC 204 shown in FIG. 11 is implemented using the SAR ADC 400 shown in FIG. 4, an MSB part of a digital output S1 may be directly used as a noise-shaped truncation output, and an LSB part of the digital output S1 may be directly used as a truncation residue S3 associated with the noise-shaped truncation output S2, where the SAR ADC 400 determines bits of the MSB part and the LSB part successively. Hence, the binary-to-thermometer converter and scrambler 1112 (which are included in DEM circuit 118 of CTDSM 100) and the MDACs 1116 (which are included in feedback DAC 120 of CTDSM 100) can start processing the noise-shaped truncation output S2/noise-shaped segmentation output NS-MSB (e.g., the MSB part of the digital output S1) when the noise-shaped truncation output S2/noise-shaped segmentation output NS-MSB (e.g., the MSB part of the digital output S1) is available. In other word, since the SAR ADC 400 determines bits of the MSB part and the LSB part sequentially, the binary-to-thermometer converter and scrambler 1112 (which are included in DEM circuit 118 of CTDSM 100) and the MDACs 1116 (which are included in feedback DAC 120 of CTDSM 100) can process the noise-shaped truncation output S2/noise-shaped segmentation output NS-MSB (e.g., the MSB part of the digital output S1) while the SAR ADC 400 is determining the truncation residue S3 (e.g., the LSB part of the digital output S1). In this way, a faster path with DWA is used, and the SAR ADC with embedded noise-shaped segmentation can have lower latency when compared to the conventional noise-shaped segmentation design.

In addition, the quantizer 1100 shown in FIG. 11 further includes an adder 1104 configured to add the noise-shaped truncation output S2/NS-MSB of a sampled analog input (e.g., currently-sampled analog input) to the noise-shaped truncation output NS-LSB of the sampled analog input (e.g., currently-sampled analog input) to generate a full-bit output (B1 bits) as a modulator output $D_{out}$ of the sampled analog input (e.g., currently-sampled analog input).

Figure 12:
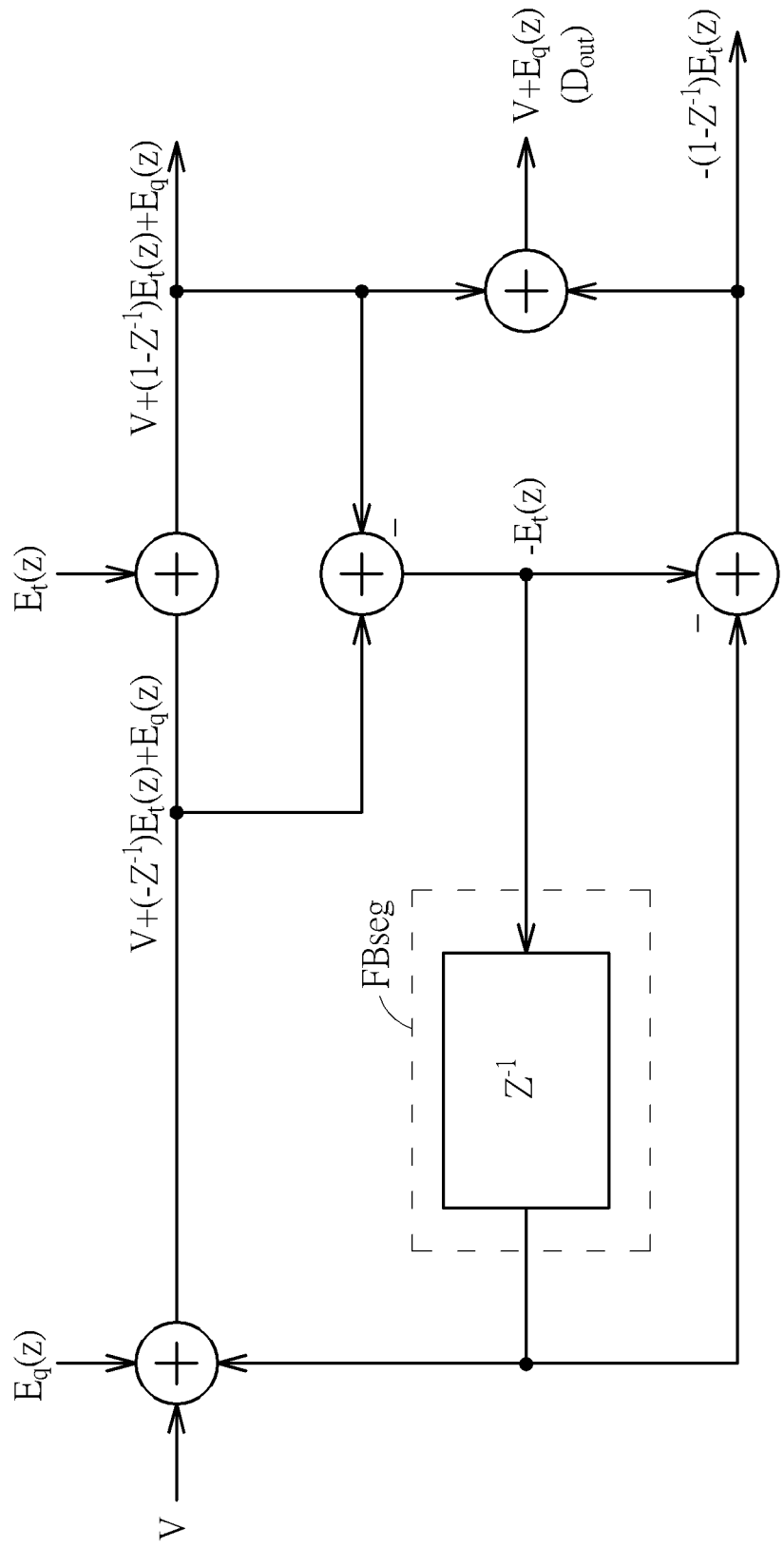
FIG. 12 is a diagram illustrating a z-domain model of the quantizer shown in FIG. 11 according to an embodiment of the present invention.

FIG. 12 is a diagram illustrating a z-domain model of the quantizer 1100 shown in FIG. 11 according to an embodiment of the present invention. The quantization noise introduced by the multi-bit ADC 204 may be represented by $E_q(z)$, and the truncation noise introduced by the truncator 206 may be represented by $E_t(z)$. Assuming that the transfer function $H(z)$ of the segmentation error feedback $FB_{seg}$ (which is provided by DAC feedback circuit 210) is $z^{-1}$, the truncation noise added to the analog input V and the truncation residue $-E_t(z)$ may be represented by $-E_t(z) \cdot z^{-1}$. Hence, the digital output S1 may be represented by $V+(-z^{-1})E_t(z)+E_q(z)$, the noise-shaped truncation output S2/noise-shaped segmentation output NS-MSB may be represented by $V+(1-z^{-1})E_t(z)+E_q(z)$, the noise-shaped truncation output S4/noise-shaped segmentation output NS-LSB may be represented by $-(1-z^{-1})E_t(z)$, and the full-bit modulator output $D_{out}$ may be represented by $V+E_q(z)$. In this embodiment, the noise transfer function (NTF) is $1-H(z)$, that is, $1-z^{-1}$. In this way, the truncation noise $E_t(z)$ is noise-shaped to the out-band. The z-domain model shown in FIG. 12 proves that the proposed quantizer design shown in FIG. 11 can achieve the desired noise-shaped segmentation function by performing error feedback summing in the analog domain, where a full-bit modulator output is available by combining the noise-shaped segmentation outputs NS-MSB and NS-LSB.

With regard to the quantizer 1100 shown in FIG. 11, the adder 1104 is configured to add the noise-shaped truncation output S2/noise-shaped segmentation output NS-MSB of a sampled analog input (e.g., currently-sampled analog input) to the noise-shaped truncation output S4/noise-shaped segment output NS-LSB of the sampled analog input (e.g., currently-sampled analog input) to generate the full-bit modulator output $D_{out}$ of the sampled analog input (e.g., currently-sampled analog input). However, this is for illustrative purposes only, and is not meant to be a limitation of the present invention. In an alternative design, the full-bit modulator output $D_{out}$ of the sampled analog input (e.g., currently-sampled analog input) may be obtained from a different signal combination of signals available in the quantizer that uses a multi-bit ADC with embedded noise-shaped segmentation.

Figure 13:
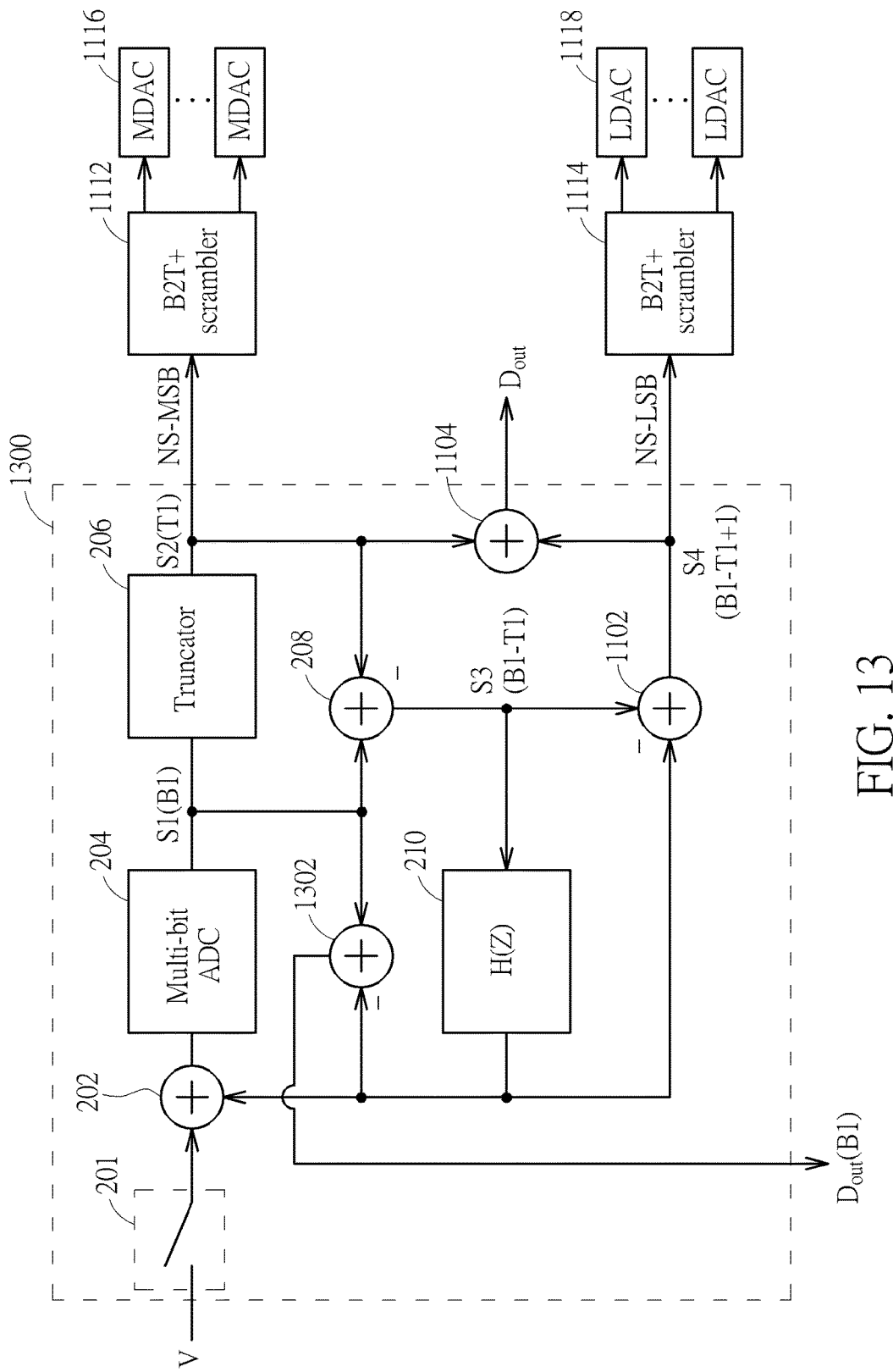
FIG. 13 is a diagram illustrating another quantizer using a multi-bit ADC with embedded noise-shaped segmentation according to an embodiment of the present invention.

FIG. 13 is a diagram illustrating another quantizer using a multi-bit ADC with embedded noise-shaped segmentation according to an embodiment of the present invention. The major difference between the quantizers 1300 and 1100 is that the quantizer 1300 has an adder 1302 configured to subtract the transferred truncation residue $H(z) \cdot S3$ associated with the noise-shaped truncation output S2 of the earlier-sampled analog input (which may be represented by $-E_t(z) \cdot z^{-1}$) from the digital output S1 of the currently-sampled analog input (which may be represented by $V+(-z^{-1})E_t(z)+E_q(z)$) to generate the full-bit modulator output $D_{out}$ of the currently-sampled analog input.

To achieve the embedded noise-shaped segmentation, the multi-bit ADC 204 used by the quantizer 1100 shown in FIG. 11 and the quantizer 1300 shown in FIG. 13 can be implemented using any ADC with an internal DAC. For one example, the multi-bit ADC 204 shown in FIG. 11/FIG. 13 may be implemented by an SAR ADC 400 shown in FIG. 4. For another example, the multi-bit ADC 204 shown in FIG. 11/FIG. 13 may be implemented by a flash ADC 1000 shown in FIG. 10.

It should be noted that the proposed noise-shaped segmentation design in the quantizer 1100/1300 is for illustrative purposes only, and is not meant to be a limitation of the present invention. Alternatively, the quantizer 1100/1300 may be modified to employ multi-cascaded stage noise-shaped segmentation as proposed in U.S. Patent Application Publication No. 2011/0018753 A1 entitled "NOISE-SHAPED SEGMENTED DIGITAL-TO-ANALOG CONVERTER" and incorporated herein by reference. A co-author of the present invention is also a co-author of U.S. Patent Application Publication No. 2011/0018753 A1. Since the principle of the multi-cascaded stage noise-shaped segmentation is already detailed in U.S. Patent Application Publication No. 2011/0018753 A1, further description is omitted here for brevity.

Figure 14:
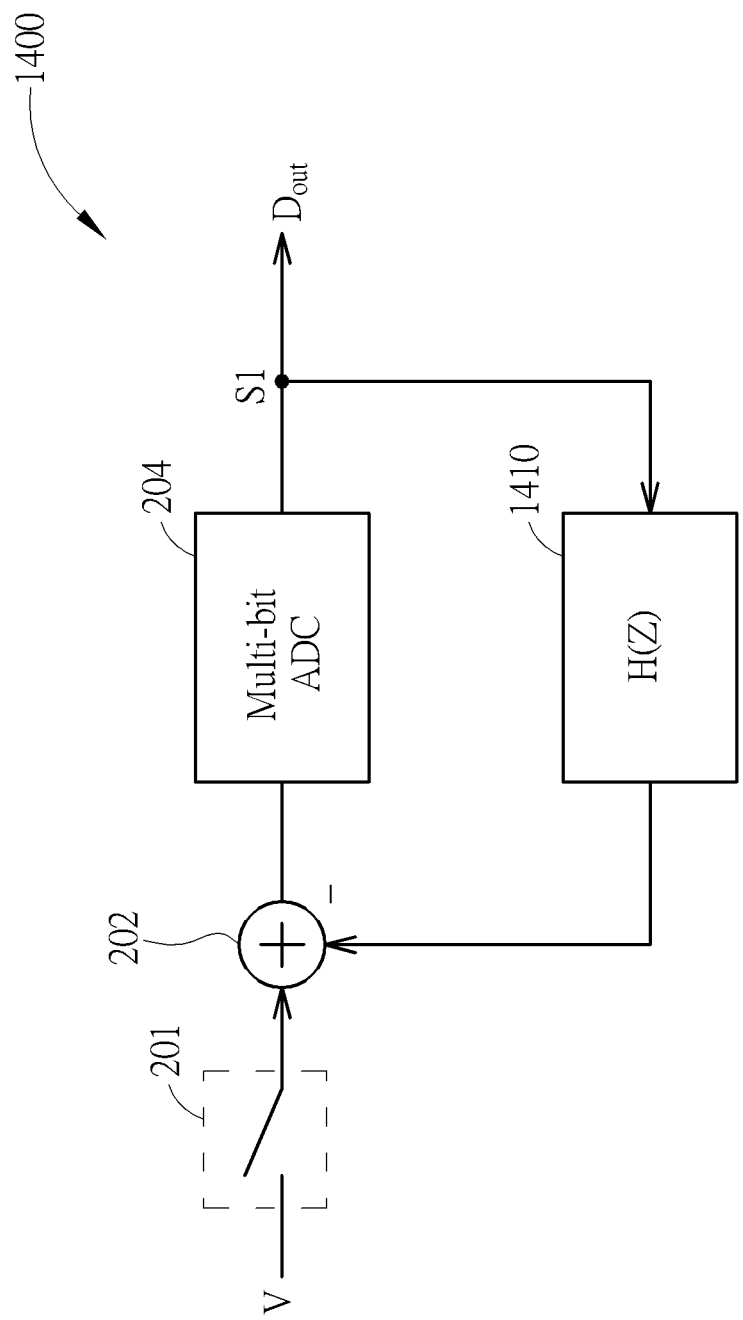
FIG. 14 is a diagram illustrating a quantizer using a multi-bit ADC with embedded ELD compensation according to an embodiment of the present invention.

FIG. 14 is a diagram illustrating a quantizer using a multi-bit ADC with embedded ELD compensation according to an embodiment of the present invention. The quantizer 1400 includes a sample and hold circuit 201, a combining circuit 202 (which performs signal subtraction in the analog domain), a multi-bit ADC 204, and an ELD compensation circuit 1410 (which has a designated transfer function $H(z)$). The sample and hold circuit 201 is configured to sample an analog input V according to a sampling clock, and hold a sampled analog input to be processed by the following multi-bit ADC 204. The multi-bit ADC 204 is configured to convert each sampled analog input into a digital output S1.

The embedded ELD compensation is achieved by the ELD compensation circuit 1410. For example, the ELD compensation circuit 1410 is configured to transfer an ELD compensation input (e.g., S1) and output a transferred ELD compensation input (e.g., $H(z) \cdot S1$) to the combining circuit 202, wherein the ELD compensation input depends on the digital output S1. For example, the transfer function $H(z)$ of the ELD compensation circuit 1410 is $K \cdot z^{-1}$, and the transferred ELD compensation input is set by applying the transfer function $H(z)$ to the digital output S1 of the sampled analog input. The combining circuit 202 may be implemented using internal circuitry (e.g., an internal DAC) of the multi-bit ADC 204 with no additional hardware cost. For one example, the multi-bit ADC 204 shown in FIG. 14 may be implemented using the SAR ADC 400 shown in FIG. 4.

For another example, the multi-bit ADC 204 shown in FIG. 14 may be implemented using the flash ADC 1000 shown in FIG. 10. Hence, the transferred ELD compensation input (e.g., $K \cdot z^{-1} \cdot S1$) is reflected in the comparison of the later-sampled analog input of the multi-bit ADC 204 via the internal DAC. For example, when the multi-bit ADC 204 shown in FIG. 14 is implemented using the SAR ADC 400, the transferred ELD compensation input (e.g., $K \cdot z^{-1} \cdot S1$) is subtracted from the later-sampled analog input via the internal DAC 402. For another example, when the multi-bit ADC 204 shown in FIG. 14 is implemented using the flash ADC 1000, the transferred ELD compensation input (e.g., $K \cdot z^{-1} \cdot S1$) is added to the reference voltages via the internal DAC 1002. Since the ELD compensation (feedback signal substation) is performed in the analog domain of the multi-bit ADC 204 by using the internal DAC of the multi-bit ADC 204, the hardware complexity is reduced due to the fact that there is no need to use an additional combiner to perform the ELD compensation, and the sampling instant disturbance can be avoided due to the fact that a discrete-time ELD compensation is performed after the sampling phase.

It should be noted that, when the earlier-sampled analog input is generated by the sample and hold circuit 201, the multi-bit ADC 204 converts the earlier-sampled analog input into a digital output S1, where an ELD compensation input (which depends on the digital output S1 of the earlier-sampled analog input) is fed back via the ELD compensation circuit 1410 with a designated transfer function H(z) to the internal DAC of the multi-bit ADC 204, such that ELD compensation is performed in the analog domain and reflected in comparison/analog-to-digital conversion of a currently-sampled analog input. When the currently-sampled analog input is generated by the sample and hold circuit 201, the multi-bit ADC 204 converts the currently-sampled analog input into a digital output S1, where an ELD compensation input (which depends on the digital output S1 of the currently-sampled analog output) is fed back via the ELD compensation circuit 1410 with a designated transfer function H(z) to the internal DAC of the multi-bit ADC 204, such that ELD compensation is performed in the analog domain and reflected in comparison/analog-to-digital conversion of a later-sampled analog input.

Figure 15:
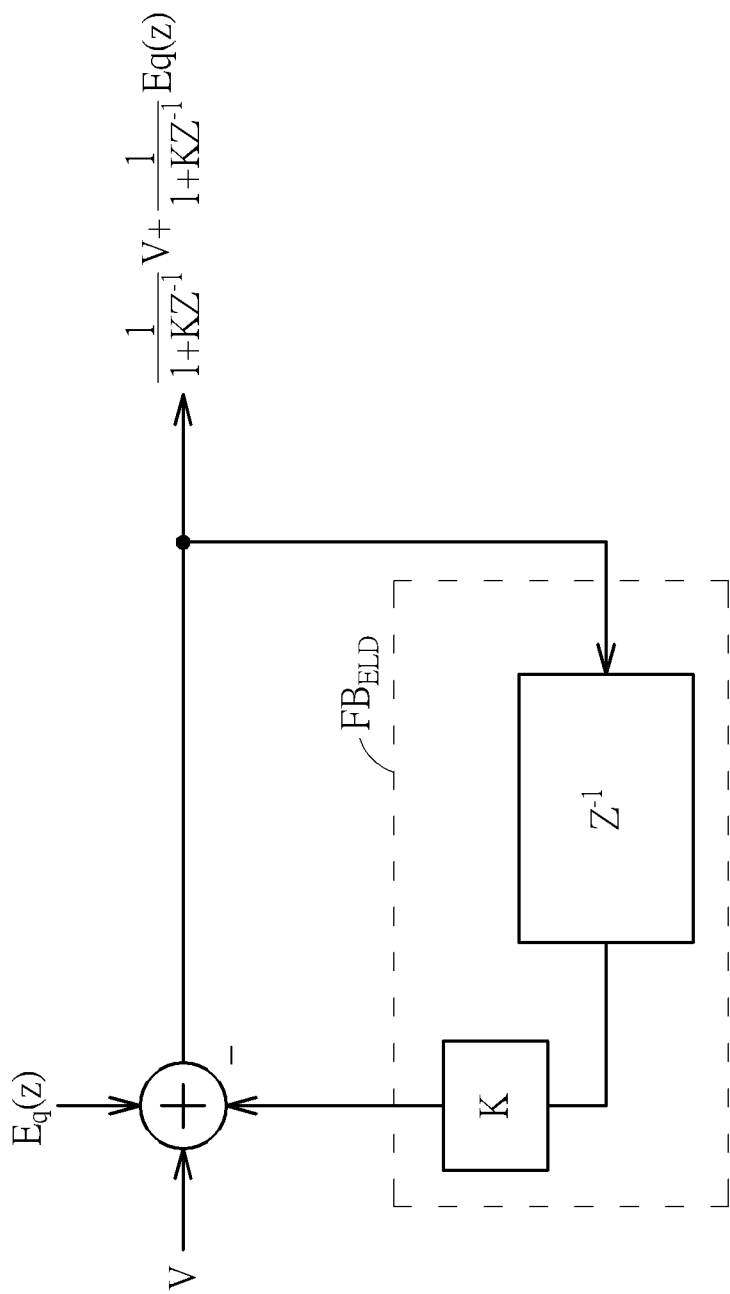
FIG. 15 is a diagram illustrating a z-domain model of the quantizer shown in FIG. 14 according to an embodiment of the present invention.

FIG. 15 is a diagram illustrating a z-domain model of the quantizer 1400 shown in FIG. 14 according to an embodiment of the present invention. The quantization noise introduced by the multi-bit ADC 204 may be represented by $E_q(z)$. Assuming that the transfer function H(z) of the ELD compensation feedback $FB_{ELD}$ (which is provided by ELD compensation circuit 1410) is $K \cdot z^{-1}$, the digital output S1 may be represented by $$\frac{1}{1+K \cdot z^{-1}} V + \frac{1}{1+K \cdot z^{-1}} E_q(z).$$

Hence, the proposed quantizer design shown in FIG. 14 can achieve the desired ELD compensation function by performing ELD compensation (feedback signal subtraction) in the analog domain.

In above embodiments, the quantizer 200 employs the embedded noise-shaped truncation technique, the quantizer 1100/1300 employs the embedded noise-shaped segmentation technique (e.g., noise-shaped segmentation design shown in FIG. 11/FIG. 13 or multi-cascaded stage noise-shaped segmentation design proposed in U.S. Patent Application Publication No. 2011/0018753 A1), and the quantizer 1400 employs the embedded ELD compensation technique. Alternatively, one quantizer may employ two or all of the embedded noise-shaped truncation technique, the embedded noise-shaped segmentation technique and the embedded ELD compensation technique. Hence, an internal DAC of a multi-bit ADC should be properly configured to support two or all of the embedded noise-shaped truncation technique, the embedded noise-shaped segmentation technique and the embedded ELD compensation technique.

Figure 16:
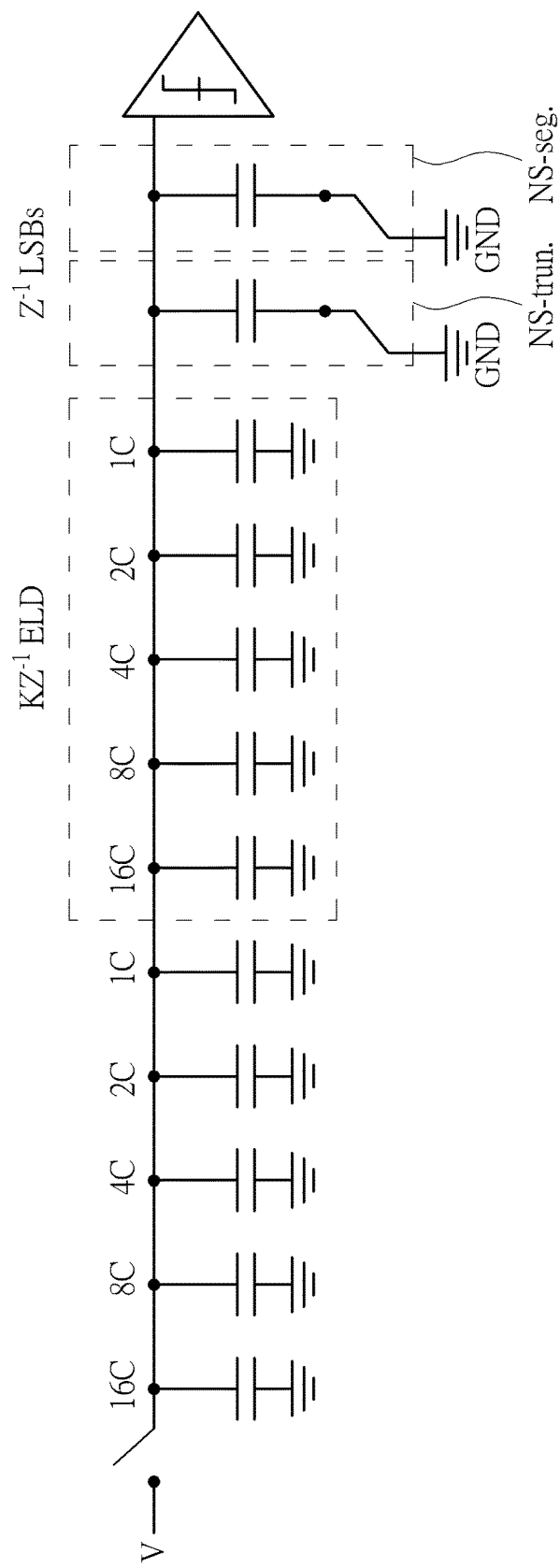
FIG. 16 is a diagram illustrating an internal DAC of an SAR ADC that is configured to support the embedded noise-shaped truncation technique, the embedded noise-shaped segmentation technique and the embedded ELD compensation technique.

FIG. 16 is a diagram illustrating an internal DAC of an SAR ADC that is configured to support the embedded noise-shaped truncation technique, the embedded noise-shaped segmentation technique and the embedded ELD compensation technique. In this embodiment, the transfer function of the ELD compensation feedback $FB_{ELD}$ is $K \cdot z^{-1}$, the transfer function of the 1-bit truncation residue feedback $FB_{trun}$ (i.e., one LSB feedback) for noise-shaped truncation is $z^{-1}$, and the transfer function of the 1-bit truncation residue feedback (i.e., one LSB feedback) $FB_{seg}$ for noise-shaped segmentation is $z^{-1}$. By way of example, but not limitation, the scaling factor K may set by capacitor ratios, and the delay $z^{-1}$ may be achieved by the internal latch circuit of the SAR ADC. The internal DAC design shown in FIG. 16 is for illustrative purposes only, and is not meant to be a limitation of the present invention. In practice, the internal DAC design of the SAR ADC should be configured based on the embedded noise-shaped truncation technique, the embedded noise-shaped segmentation technique, and/or the embedded ELD compensation technique employed. Similarly, when an internal DAC of a flash ADC is used to support the embedded noise-shaped truncation technique, the embedded noise-shaped segmentation technique, and/or the embedded ELD compensation technique, the internal DAC should be properly controlled to adjust the reference voltages used for analog-to-digital conversion.

For better understanding of technical features of the present invention, several exemplary quantizers employing two or all of the embedded noise-shaped truncation technique, the embedded noise-shaped segmentation technique (e.g., noise-shaped segmentation design shown in FIG. 11/FIG. 13 or multi-cascaded stage noise-shaped segmentation design proposed in U.S. Patent Application Publication No. 2011/0018753 A1) and the embedded ELD compensation technique are provided as below.

Figure 17:
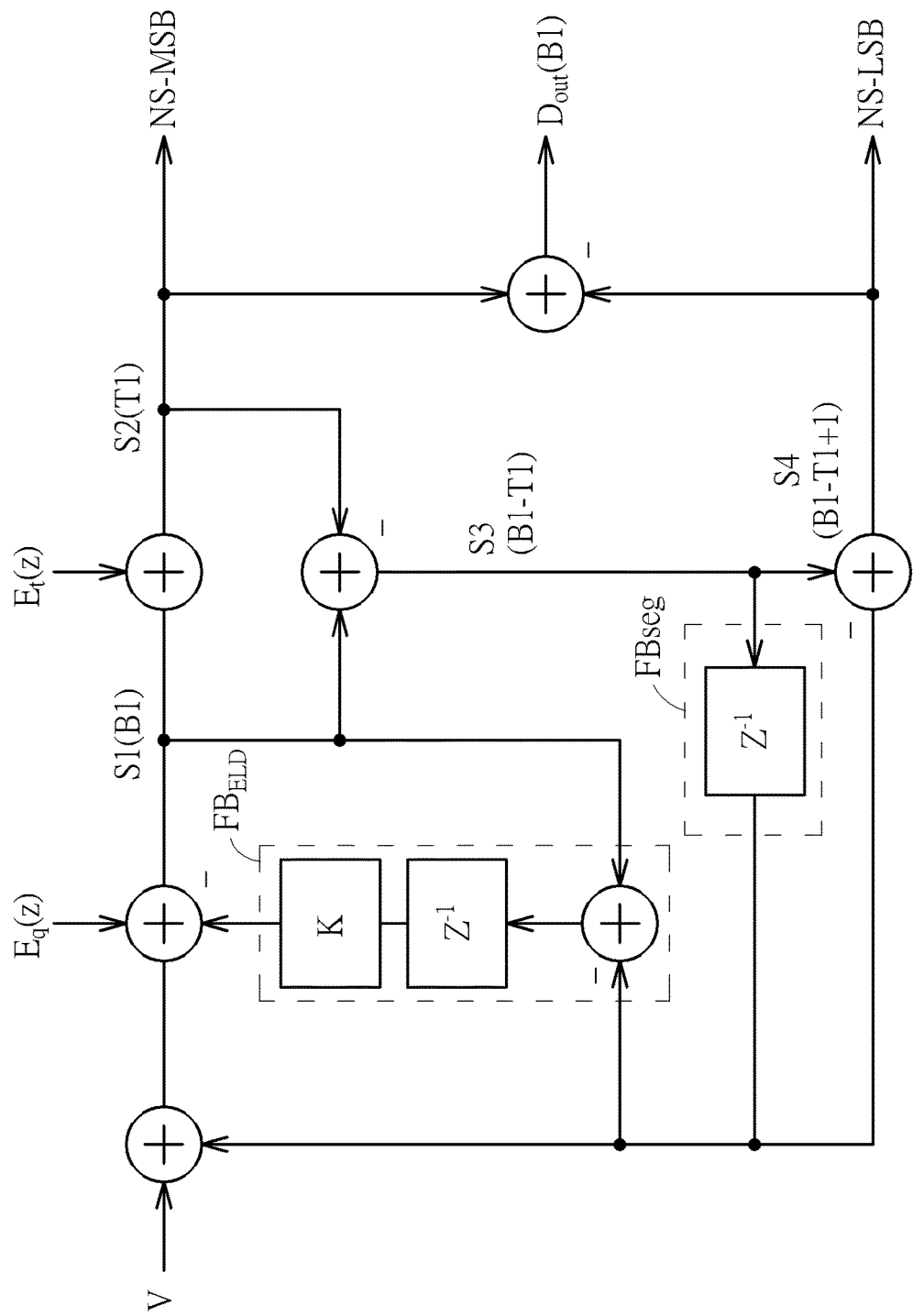
FIG. 17 is a diagram illustrating a z-domain model of a quantizer having a multi-bit ADC with embedded noise-shaped segmentation and embedded ELD compensation according to an embodiment of the present invention.

FIG. 17 is a diagram illustrating a z-domain model of a quantizer having a multi-bit ADC with embedded noise-shaped segmentation and embedded ELD compensation according to an embodiment of the present invention. The quantizer shown in FIG. 17 may be regarded as a combination of the quantizer 1100 shown in FIG. 11, the adder 1302 shown in FIG. 13, and the ELD compensation circuit 1410 shown in FIG. 14, where an output of the adder 1302 is used as an input of the ELD compensation circuit 1410. The quantization noise introduced by the multi-bit ADC 204 is represented by $E_q(z)$, and the segmentation noise (i.e., truncation noise) introduced by the truncator 206 of the noise-shaped segmentation circuit is represented by $E_t(z)$. When a currently-sampled analog input is generated and processed, the adder 1302 used in the quantizer shown in FIG. 17 generates an ELD compensation input to the ELD compensation circuit 1410 used in the quantizer shown in FIG. 17 by subtracting the transferred truncation residue $z^{-1} \cdot S3$ associated with the noise-shaped truncation S2 of an earlier-sampled analog input from a truncation residue S3 associated with the noise-shaped truncation S2 of the currently-sampled analog input.

Figure 18:
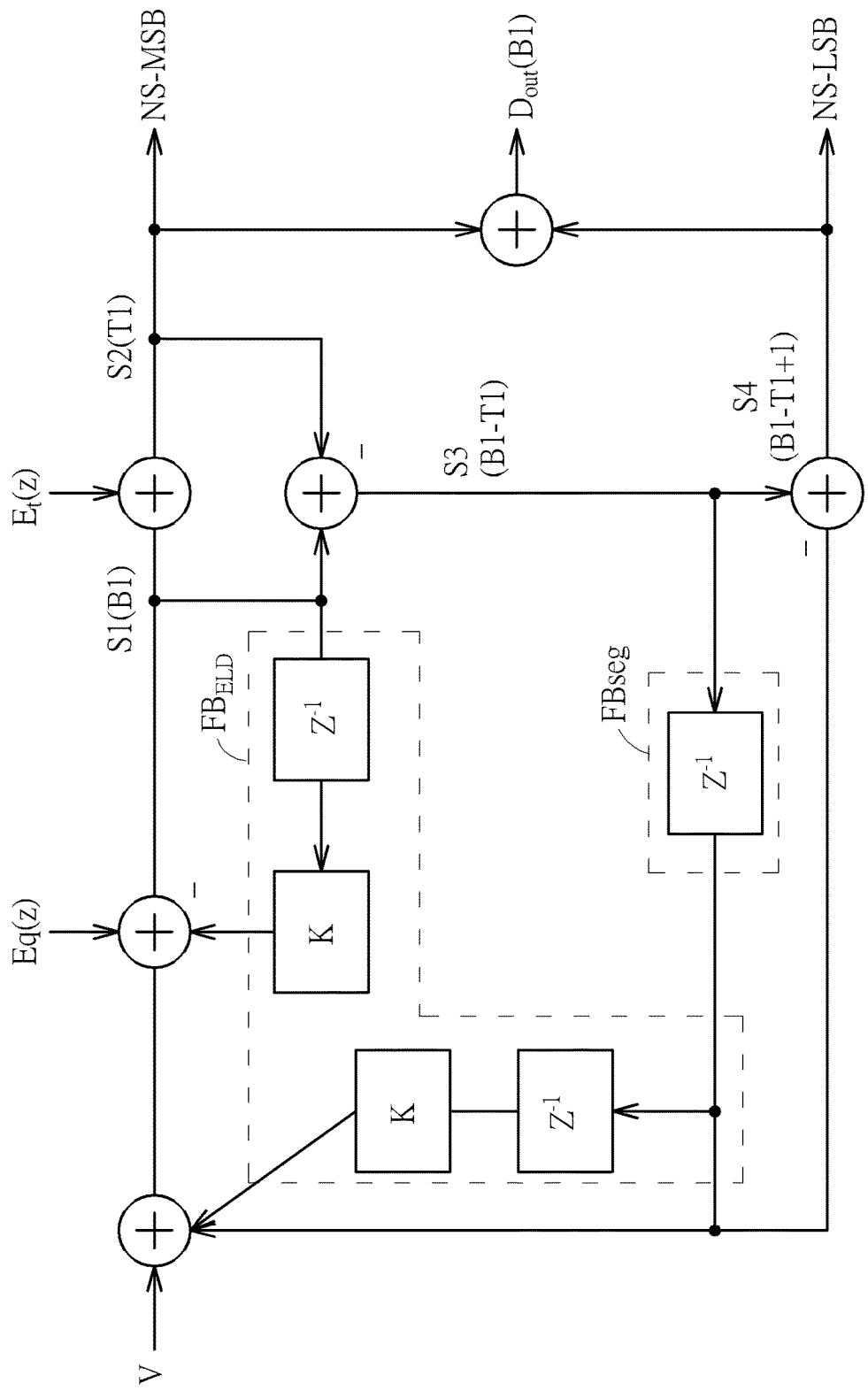
FIG. 18 is a diagram illustrating a z-domain model of another quantizer having a multi-bit ADC with embedded noise-shaped segmentation and embedded ELD compensation according to an embodiment of the present invention.

The ELD compensation feedback $FB_{ELD}$ shown in FIG. 17 may be replaced by any equivalent feedback design that uses signal(s) available in the quantizer. FIG. 18 is a diagram illustrating a z-domain model of another quantizer having a multi-bit ADC with embedded noise-shaped segmentation and embedded ELD compensation according to an embodiment of the present invention. The major difference between the quantizers shown in FIG. 17 and FIG. 18 is that the ELD compensation feedback $FB_{ELD}$ of the quantizer shown in FIG. 18 is implemented using an ELD compensation circuit with two feedback paths, each having the same transfer function $K \cdot z^{-1}$. One feedback path transfers the digital output S1 (i.e., a digital output of a currently-sampled analog output) to an internal DAC of the multi-bit ADC 204 (e.g., SAR ADC or flash ADC), such that the transferred digital output $S1 \cdot K \cdot z^{-1}$ is subtracted in the analog domain via the internal DAC of the multi-bit ADC 204. The other feedback path transfers an output of the DAC feedback circuit 210 (i.e., a transferred truncation residue $z^{-1} \cdot S3$ associated with a noise-shaped truncation output S2/noise-shaped segmentation output NS-MSB of an earlier-sampled analog input) to the internal DAC of the multi-bit ADC 204 (e.g., SAR ADC or flash ADC), such that the transferred truncation residue $K \cdot z^{-1} \cdot S3$ is added in the analog domain via the internal DAC of the multi-bit ADC 204. Compared to the ELD compensation feedback design shown in FIG. 17, the ELD compensation feedback design shown in FIG. 18 uses one less adder.

The alternative ELD compensation feedback design shown in FIG. 18 is merely one embodiment of the present invention. In other alternative ELD compensation feedback designs, a signal source of the ELD compensation feedback may include the noise-shaped segmentation output NS-MSB and/or the noise-shaped segmentation output NS-LSB. To put it simply, the present invention has no limitations on the ELD compensation feedback design, and any ELD compensation feedback that can provide the desired ELD compensation can be employed.

Figure 19:
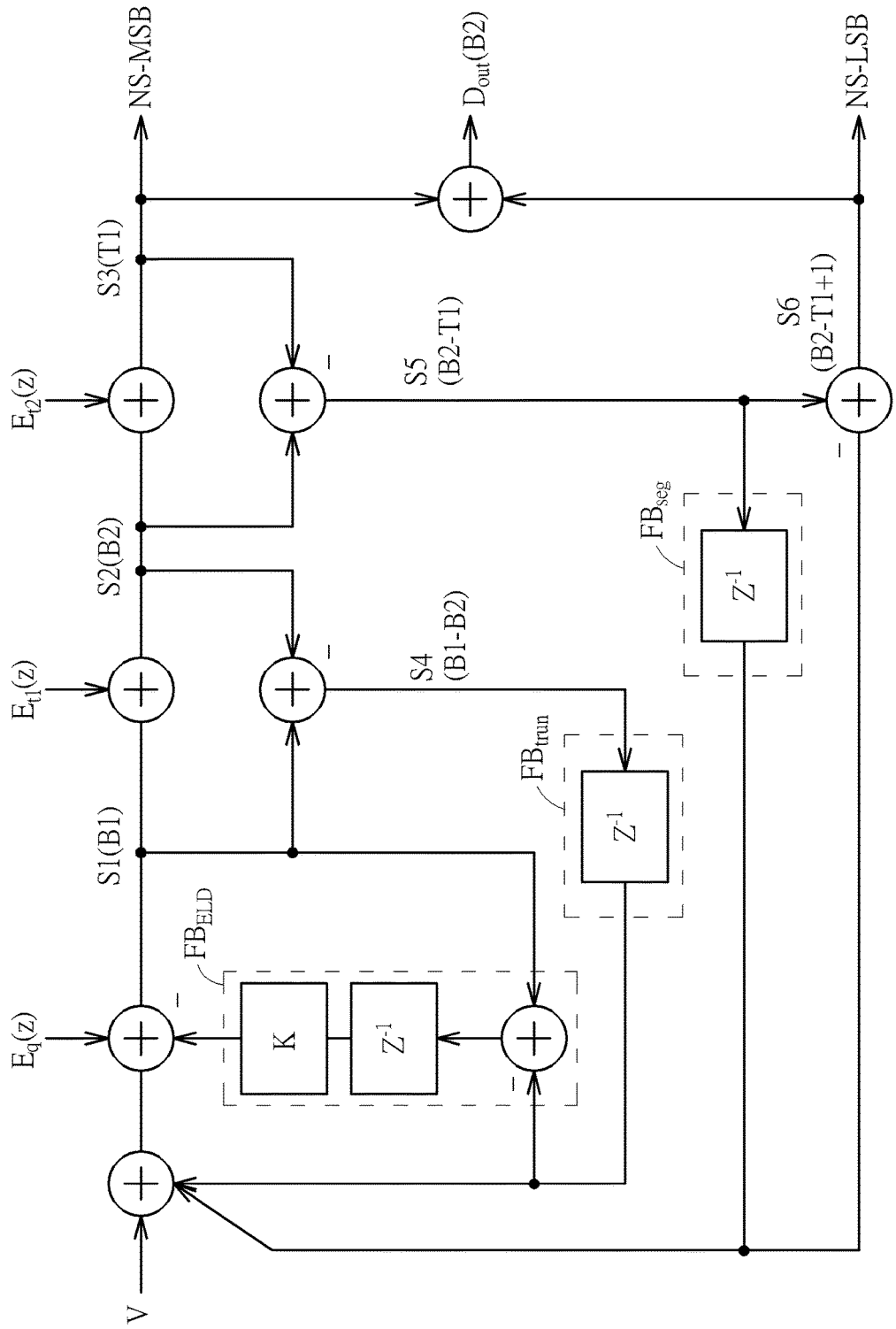
FIG. 19 is a diagram illustrating a z-domain model of a quantizer having a multi-bit ADC with embedded noise-shaped truncation, embedded noise-shaped segmentation and embedded ELD compensation according to an embodiment of the present invention.

FIG. 19 is a diagram illustrating a z-domain model of a quantizer having a multi-bit ADC with embedded noise-shaped truncation, embedded noise-shaped segmentation and embedded ELD compensation according to an embodiment of the present invention. The quantizer shown in FIG. 19 may be regarded as a combination of the quantizer 200 shown in FIG. 2, the noise-shaped segmentation circuit (which includes truncater 206, adder 208, DAC feedback circuit 210 and adders 1102, 1104) shown in FIG. 11, the adder 1302 shown in FIG. 13, and the ELD compensation circuit 1410 shown in FIG. 14, where a noise-shaped truncation output S2 shown in FIG. 2 is used as an input of the noise-shaped segmentation circuit (i.e., an input of the truncater 206 shown in FIG. 11), and an output of the adder 1302 is used as an input of the ELD compensation circuit 1410. The quantization noise introduced by the multi-bit ADC 204 is represented by $E_q(z)$, the truncation noise introduced by the noise-shaped truncation circuit is represented by $E_{t1}(z)$, and the segmentation noise (i.e., truncation noise) introduced by the noise-shaped segmentation circuit is represented by $E_{t2}(z)$. When a currently-sampled analog input is generated and processed, a digital output S1 (B1 bits) of the currently-sampled analog input is generated, a noise-shaped truncation output S2 (B2 bits) and an associated truncation residue S4 (B1–B2 bits) are generated from the digital output S1 of the currently-sampled analog input by the noise-shaped truncation circuit, a noise-shaped truncation output S3 (T1 bits)/noise-shaped segmentation output NS-MSB and a truncation residue S5 (B2–T1 bits) are generated from the noise-shaped truncation output S2 of the currently-sampled analog input by the noise-shaped segmentation circuit, a noise-shaped truncation output S6 (B2–T1+1)/noise-shaped segmentation output NS-LSB with one bit overlapped is generated from the truncation residue S5 of the currently sampled analog input and a transferred truncation residue $z^{-1} \cdot S5$ of an earlier-sampled analog input by the noise-shaped segmentation circuit, a full-bit modulator output $D_{out}$ is generated from the noise-shaped segmentation outputs NS-MSB and NS-LSB of the currently-sampled analog input by the noise-shaped segmentation circuit, and an ELD compensation input is generated by subtracting the transferred truncation residue $z^{-1} \cdot S4$ associated with the noise-shaped truncation output S2 of the earlier-sampled analog input from the digital output S1 of the currently-sampled analog input.

The digital output S1 may be composed of an MSB part, a central significant bit (CSB) part and an LSB part, where the MSB part may directly serve as the noise-shaped truncation output S3/noise-shaped segmentation output NS-MSB, the CSB part may directly serves as the truncation residue S5, and the LSB part may directly serve as the truncation residue S4. In a case where the multi-bit ADC is implemented using an SAR ADC, the SAR ADC determines bits of the MSB part, the CSB part and the LSB part successively. Hence, the DEM circuit 118 and the feedback DAC 120 of the CTDSM 100 can start processing the noise-shaped truncation output S3/noise-shaped segmentation output NS-MSB (e.g., the MSB part of the digital output S1) when the noise-shaped truncation output S3/noise-shaped segmentation output NS-MSB (e.g., the MSB part of the digital output S1) is available. In other word, the DEM circuit 118 and the feedback DAC 120 of the CTDSM 100 can process the noise-shaped truncation output S3/noise-shaped segmentation output NS-MSB (e.g., the MSB part of the digital output S1) while the SAR ADC 400 is determining the truncation residue S5 (e.g., the CSB part of the digital output S1) or the truncation residue S4 (e.g., the LSB part of the digital output S1). In this way, the SAR ADC with embedded noise-shaped truncation, embedded noise-shaped segmentation and embedded ELD compensation can have lower latency. In one exemplary design, the CSB part of the digital output S1 may include one bit only, and the LSB part of the digital output S1 may include one bit only.

It should be noted that the ELD compensation feedback $FB_{ELD}$ shown in FIG. 19 may be replaced by any equivalent feedback design that uses signal(s) available in the quantizer. For example, the ELD compensation feedback $FB_{ELD}$ shown in FIG. 19 may be replaced by the ELD compensation feedback $FB_{ELD}$ shown in FIG. 18. However, this is for illustrative purposes only, and is not meant to be a limitation of the present invention.

Figure 20:
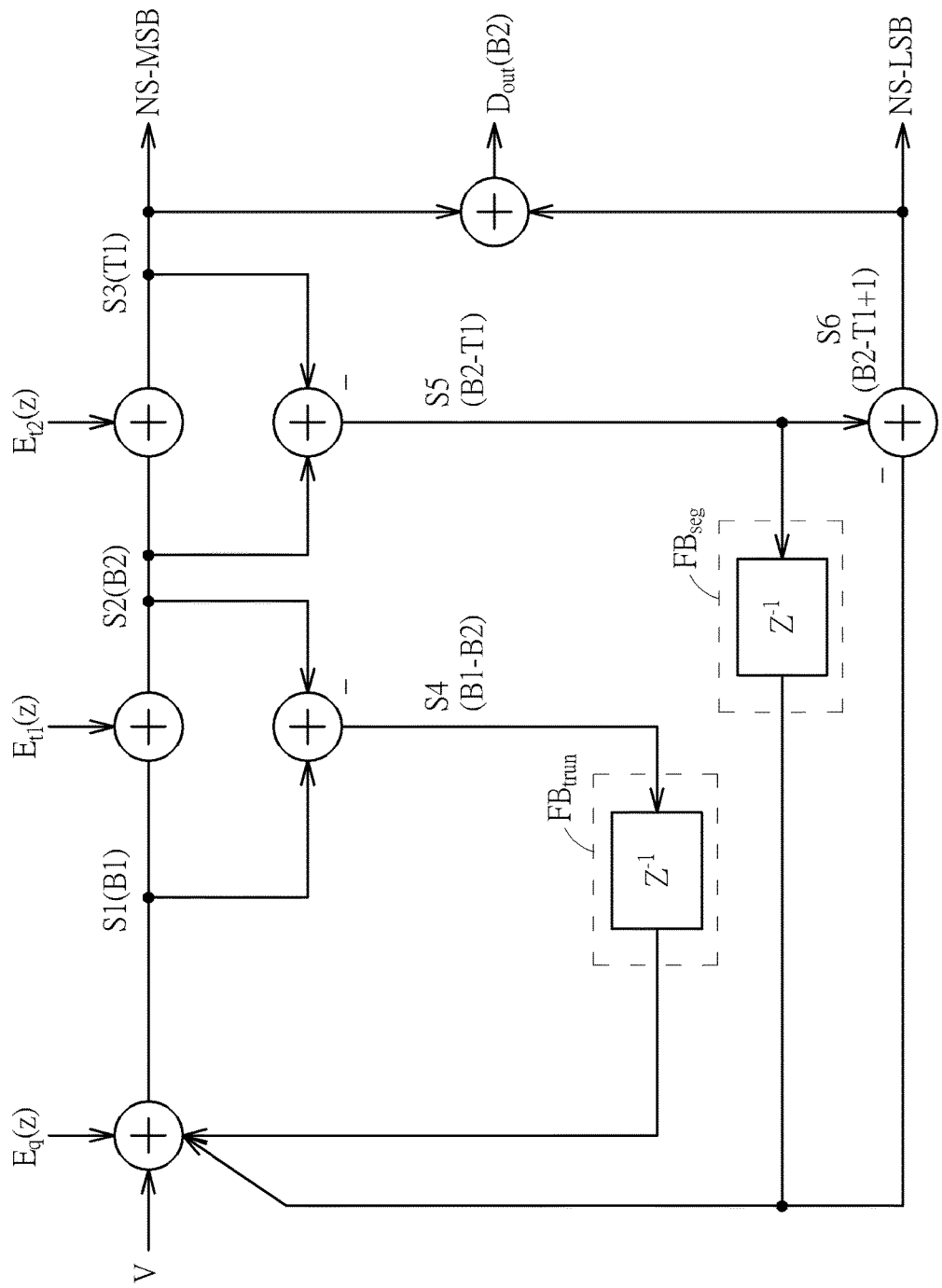
FIG. 20 is a diagram illustrating a z-domain model of a quantizer having a multi-bit ADC with embedded noise-shaped truncation and embedded noise-shaped segmentation according to an embodiment of the present invention.

FIG. 20 is a diagram illustrating a z-domain model of a quantizer having a multi-bit ADC with embedded noise-shaped truncation and embedded noise-shaped segmentation according to an embodiment of the present invention. The quantizer shown in FIG. 20 may be built by removing the ELD compensation circuit from the quantizer shown in FIG. 19. Further description is omitted here for brevity.

Alternatively, the embedded noise-shaped segmentation in the quantizers shown in FIGS. 17-20 may be modified to employ multi-cascaded stage noise-shaped segmentation proposed in U.S. Patent Application Publication No. 2011/0018753 A1.

Figure 21:
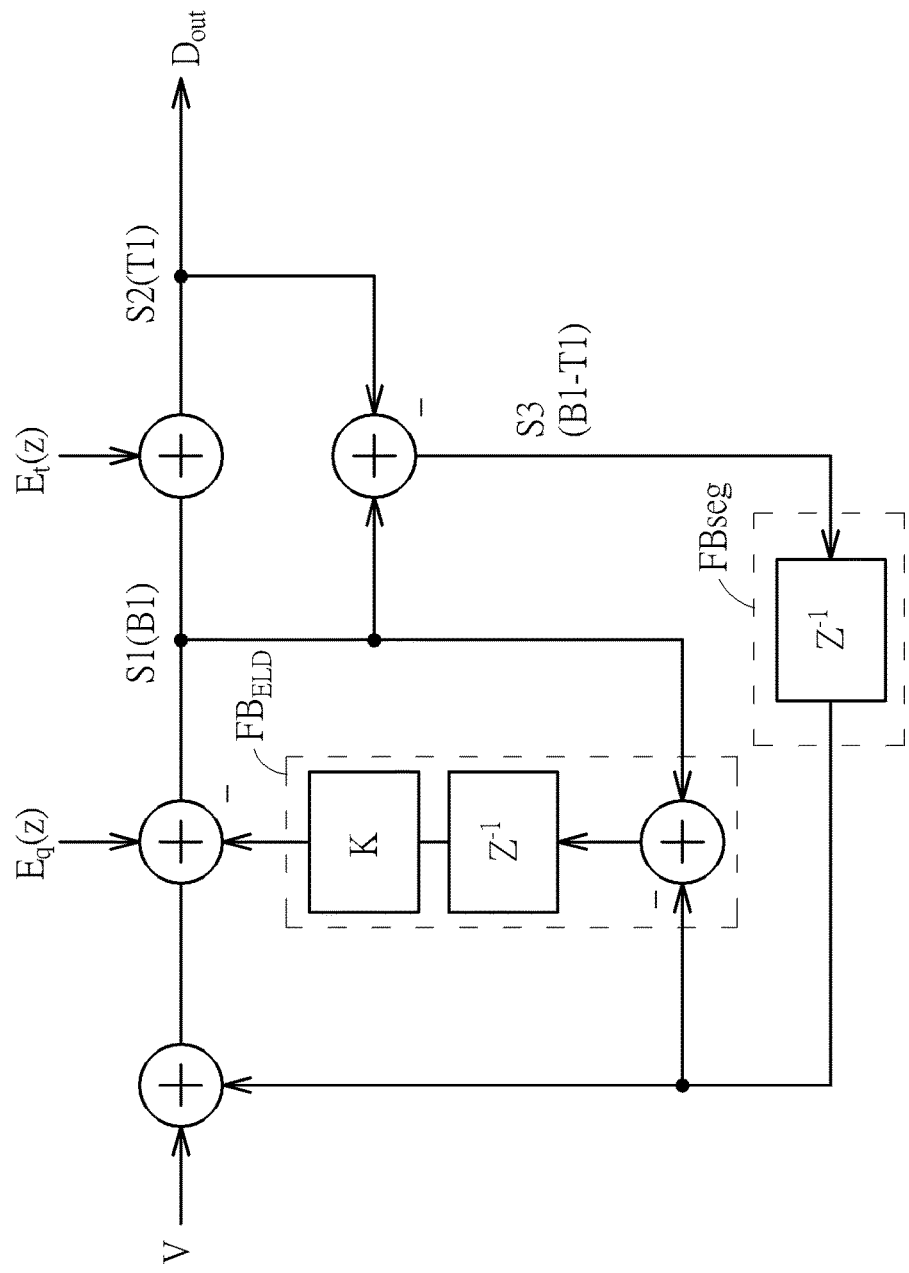
FIG. 21 is a diagram illustrating a z-domain model of a quantizer having a multi-bit ADC with embedded noise-shaped truncation and embedded ELD compensation according to an embodiment of the present invention.
Figure 22:
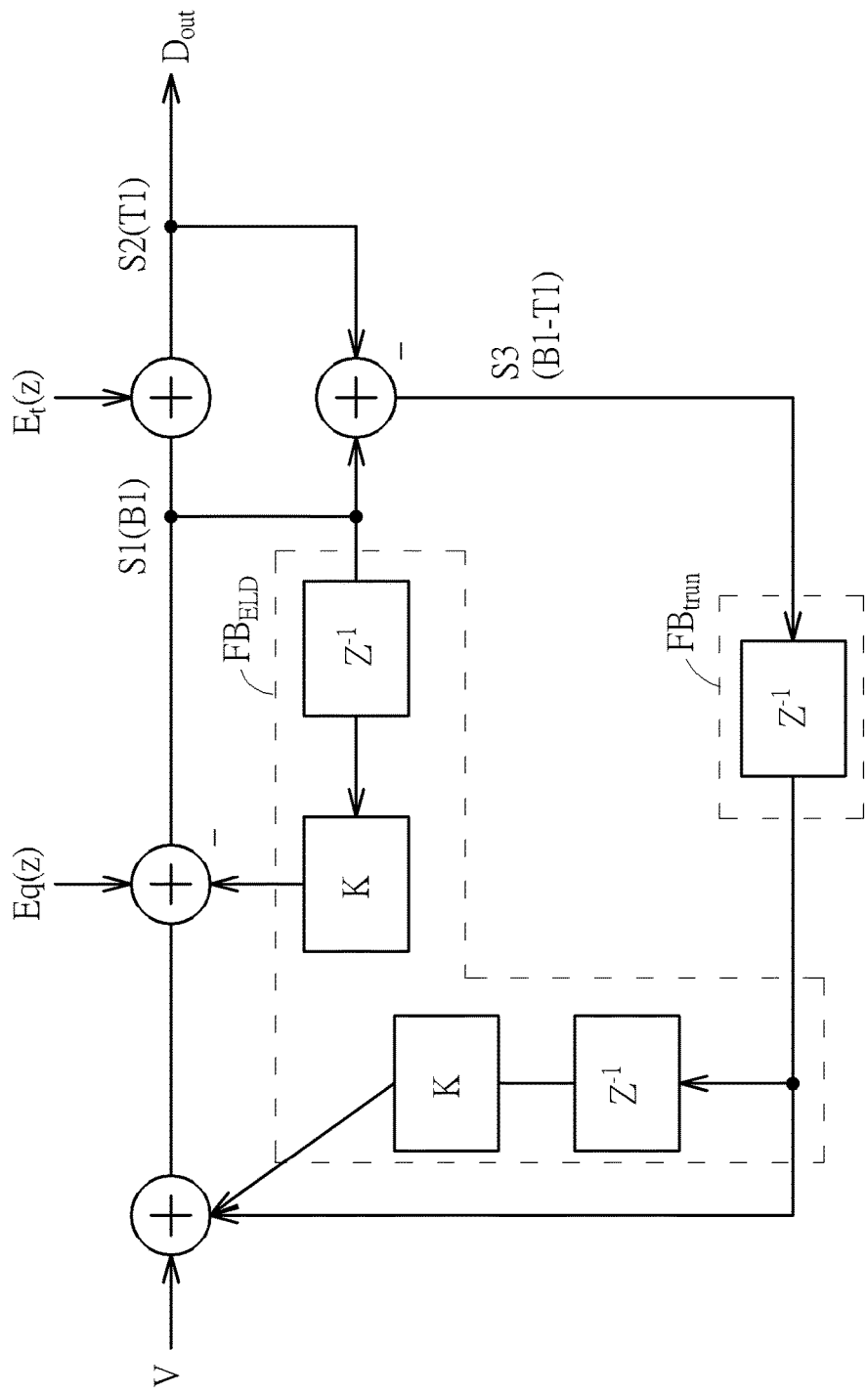
FIG. 22 is a diagram illustrating a z-domain model of another quantizer having a multi-bit ADC with embedded noise-shaped truncation and embedded ELD compensation according to an embodiment of the present invention.

FIG. 21 is a diagram illustrating a z-domain model of a quantizer having a multi-bit ADC with embedded noise-shaped truncation and embedded ELD compensation according to an embodiment of the present invention. The quantizer shown in FIG. 21 may be regarded as a combination of the quantizer 200 shown in FIG. 2, the adder 1302 shown in FIG. 13, and the ELD compensation circuit 1410 shown in FIG. 14, where an output of the adder 1302 is used as an input of the ELD compensation circuit 1410 shown in FIG. 14. The ELD compensation feedback $FB_{ELD}$ shown in FIG. 21 may be replaced by any equivalent feedback design that uses signal(s) available in the quantizer. FIG. 22 is a diagram illustrating a z-domain model of another quantizer having a multi-bit ADC with embedded noise-shaped truncation and embedded ELD compensation according to an embodiment of the present invention. The major difference between the quantizers shown in FIG. 21 and FIG. 22 is that the ELD compensation feedback $FB_{ELD}$ of the quantizer shown in FIG. 21 is replaced by the ELD compensation feedback $FB_{ELD}$ shown in FIG. 18. Since a person skilled in the art can readily understand details of the quantizers shown in FIG. 20 and FIG. 21 after reading above paragraphs, further description is omitted here for brevity.

Figure 23:
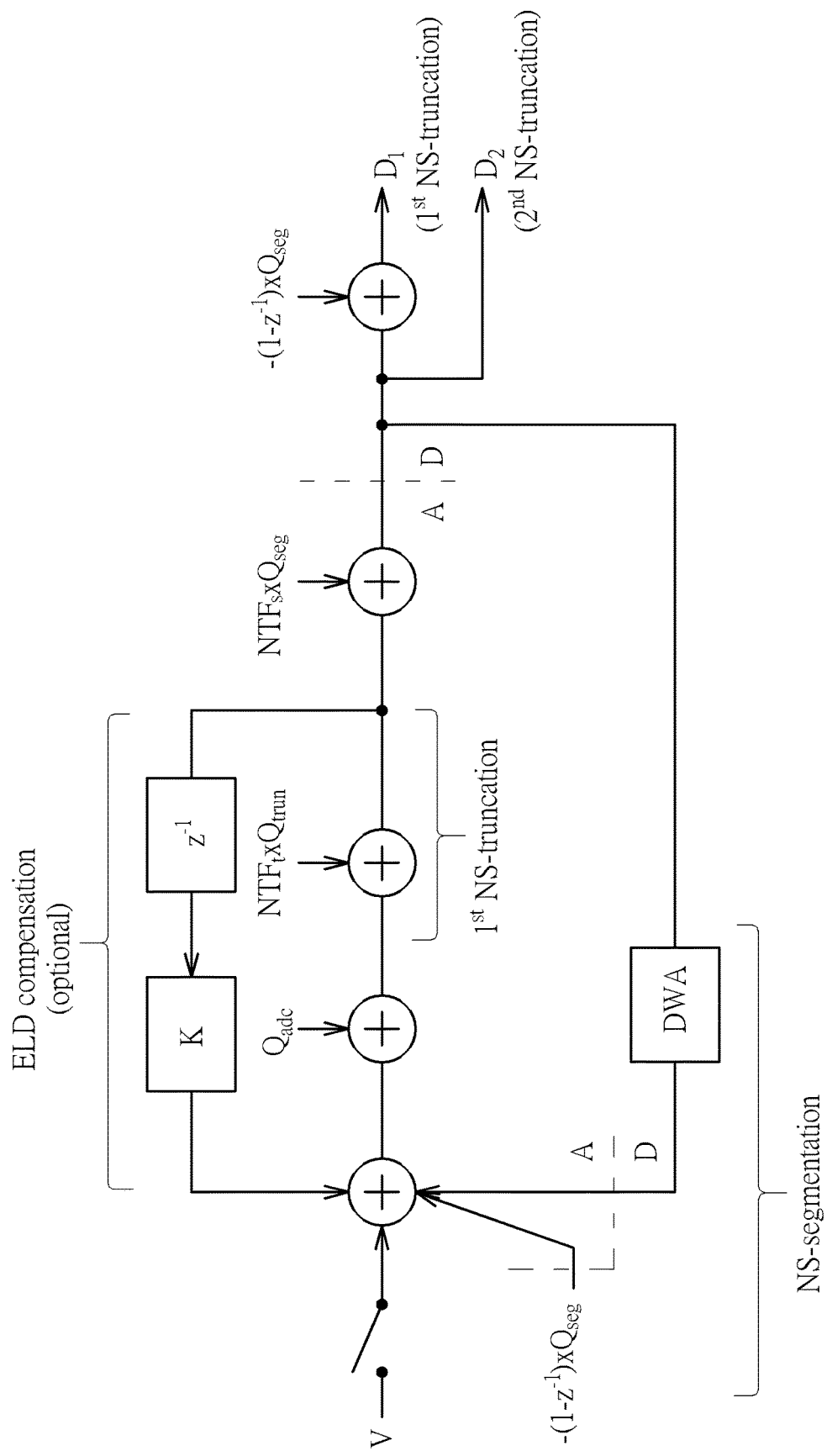
FIG. 23 is a diagram illustrating a z-domain model of a continuous-time delta-sigma modulator having a quantizer with embedded noise-shaped segmentation, embedded noise-shaped segmentation and embedded ELD compensation according to an embodiment of the present invention.

FIG. 23 is a diagram illustrating a z-domain model of a continuous-time delta-sigma modulator having a quantizer with embedded noise-shaped segmentation, embedded noise-shaped segmentation and embedded ELD compensation according to an embodiment of the present invention. The quantization noise introduced by an ADC is represented by $Q_{adc}$. The truncation noise introduced by the embedded noise-shaped truncation (denoted by "NS-truncation") is represented by $Q_{trun}$. The noise transfer function of the NS-truncation is represented by $NTF_t$. Hence, the noise-shaped truncation noise is represented by $NTF_t*Q_{trun}$. The segmentation noise introduced by the embedded noise-shaped segmentation (denoted by "NS-segmentation") is represented by $Q_{seg}$. The noise transfer function of the NS-segmentation is represented by $NTF_s$. Hence, the noise-shaped segmentation noise is represented $NTF_s*Q_{seg}$. In this example, dynamic element matching (DEM) performed at the feedback path is implemented using a data weighted averaging (DWA) algorithm. In addition, a digital domain is indicated by a symbol "D", while an analog domain is indicated by a symbol "A". The first NS-truncation output is represented by $D_1$, and the second NS-truncation output is represented by $D_2$. It should be noted that the embedded ELD compensation (which has a transfer function $K \cdot z^{-1}$) is optional. Hence, the embedded ELD compensation may be omitted, depending upon actual design considerations. As a person skilled in the art can readily understand details of the z-domain model shown in FIG. 23 after reading above paragraphs directed to z-domain models shown in FIGS. 3, 12 and 15, further description is omitted here for brevity.

Figure 24:
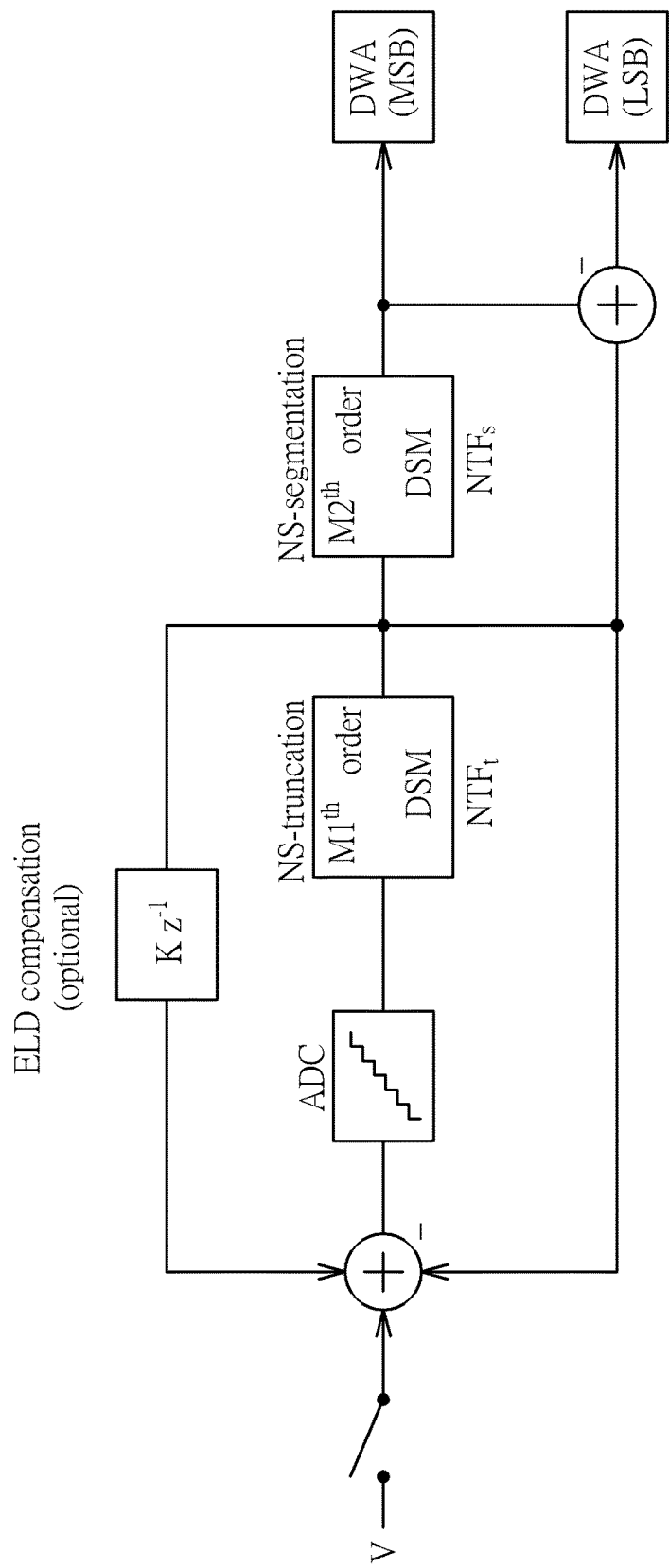
FIG. 24 is a block diagram illustrating a continuous-time delta-sigma modulator implemented based on the z-domain model shown in FIG. 23 according to an embodiment of the present invention.

FIG. 24 is a block diagram illustrating a continuous-time delta-sigma modulator implemented based on the z-domain model shown in FIG. 23 according to an embodiment of the present invention. The ADC may be an SAR ADC or a flash ADC. The embedded noise-shaped truncation may be achieved by using an $M1^{th}$ order delta-sigma modulator (DSM) with a noise transfer function $NTF_t$. An output of the $M1^{th}$ order delta-sigma modulator is further processed by an $M2^{th}$ order DSM with a noise transfer function $NTF_s$ to achieve the embedded noise-shaped segmentation. One noise-shaped segmentation output is transmitted to MSB DAC cells through the DWA algorithm, and the other noise-shaped segmentation output is transmitted to LSB DAC cells through the DWA algorithm. The embedded ELD compensation is implemented by a processing circuit with a transfer function $K \cdot z^{-1}$. As mentioned above, the embedded ELD compensation may be omitted, depending upon actual design considerations.

Figure 25:
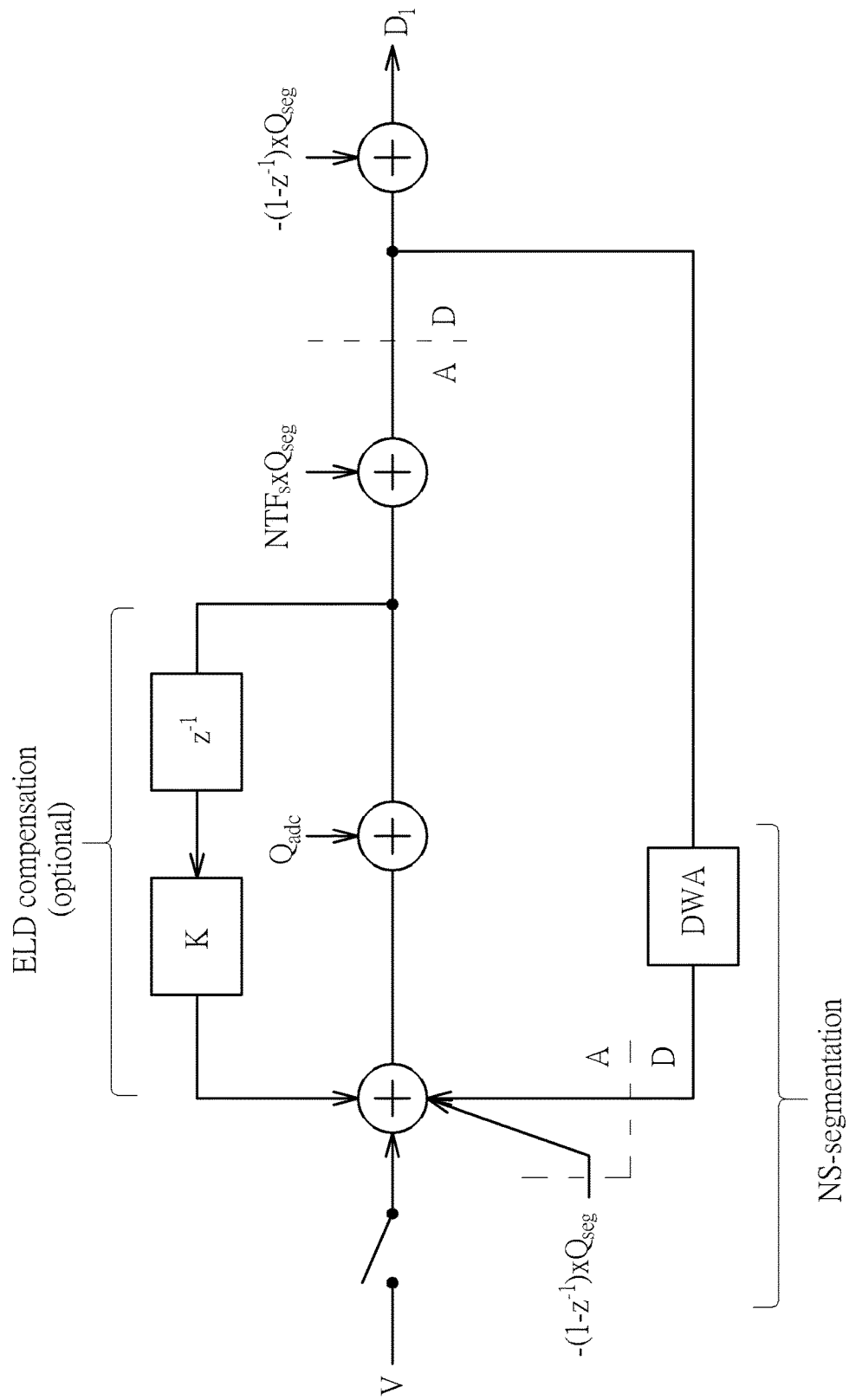
FIG. 25 is a diagram illustrating a z-domain model of a continuous-time delta-sigma modulator having a quantizer with embedded noise-shaped segmentation and embedded ELD compensation according to an embodiment of the present invention.

FIG. 25 is a diagram illustrating a z-domain model of a continuous-time delta-sigma modulator having a quantizer with embedded noise-shaped segmentation and embedded ELD compensation according to an embodiment of the present invention. The major difference between the z-domain models shown in FIG. 23 and FIG. 25 is that the embedded noise-shaped truncation is not included in the z-domain model shown in FIG. 25. Similarly, the embedded ELD compensation (which has a transfer function $K \cdot z^{-1}$) may be omitted, depending upon actual design considerations.

Figure 26:
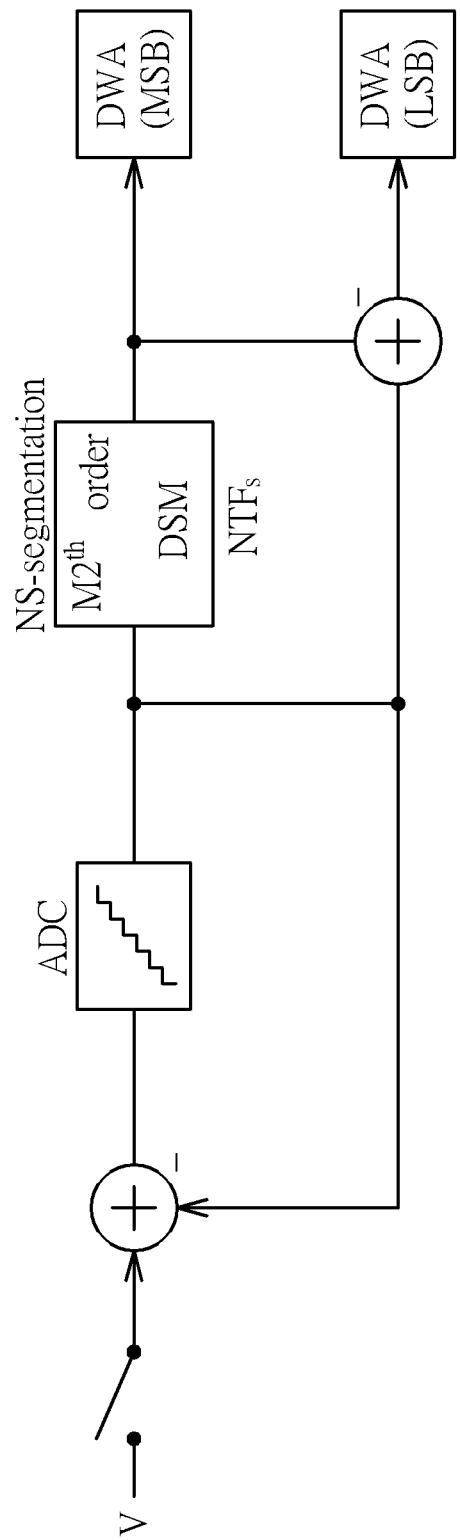
FIG. 26 is a block diagram illustrating a continuous-time delta-sigma modulator implemented based on the z-domain model shown in FIG. 25 according to an embodiment of the present invention.

FIG. 26 is a block diagram illustrating a continuous-time delta-sigma modulator implemented based on the z-domain model shown in FIG. 25 according to an embodiment of the present invention. In this embodiment, the embedded ELD compensation can be omitted, and the embedded noise-shaped segmentation may be realized by using an $M2^{th}$ order delta-sigma modulator (DSM) with a noise transfer function $NTF_s$. One noise-shaped segmentation output is transmitted to MSB DAC cells through the DWA algorithm, and the other noise-shaped segmentation output is transmitted to LSB DAC cells through the DWA algorithm. The ADC may be an SAR ADC or a flash ADC.

In above embodiments, the transfer function H(z) of the DAC feedback circuit for the embedded noise-shaped truncation is set by $z^{-1}$ to achieve a $1^{st}$-order noise transfer function $(1-z^{-1})$, and the transfer function H(z) of the DAC feedback circuit for the embedded noise-shaped segmentation is set by $z^{-1}$ to achieve a $1^{st}$-order noise transfer function $(1-z^{-1})$. However, this is for illustrative purposes only, and is not meant to be a limitation of the present invention. In practice, the transfer function H(z) of the DAC feedback circuit for the embedded noise-shaped truncation may be configured based on a desired noise transfer function, and/or the transfer function H(z) of the DAC feedback circuit for the embedded noise-shaped segmentation may be configured based on a desired noise transfer function. For example, based on the error feedback architecture, using a higher-order noise transfer function may be feasible. Assume that the noise transfer function is 1–H(z) for the error feedback architecture employed. The transfer function H(z) of the DAC feedback circuit for the embedded noise-shaped truncation is set by $2z^{-1}-z^{-2}$ to achieve a $2^{nd}$-order noise transfer function $(1-Z^{-1})^2$, and/or the transfer function H(z) of the DAC feedback circuit for the embedded noise-shaped segmentation is set by $2z^{-1}-z^{-2}$ to achieve a $2^{nd}$-order noise transfer function $(1-Z^{-1})^2$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quantizer comprising:
a multi-bit analog-to-digital converter (ADC), having an internal digital-to-analog converter (DAC) associated with comparison of each sampled analog input of the multi-bit ADC, wherein the multi-bit ADC converts a currently-sampled analog input into a first digital output, and a first noise-shaped truncation output is derived from the first digital output; and
a first DAC feedback circuit, configured to transfer a first truncation residue associated with the first noise-shaped truncation output to the internal DAC, wherein the transferred first truncation residue is reflected in comparison of a later-sampled analog input of the multi-bit ADC via the internal DAC.

2. The quantizer of claim 1, wherein the multi-bit ADC is a successive approximation register (SAR) ADC.

3. The quantizer of claim 1, wherein the multi-bit ADC is a flash ADC.

4. The quantizer of claim 1, wherein the first digital output of the multi-bit ADC comprises a most significant bit (MSB) part and a least significant bit (LSB) part, and the MSB part directly serves as the first noise-shaped truncation output, and the LSB part directly serves as the first truncation residue.

5. The quantizer of claim 1, wherein the quantizer is implemented in a continuous-time delta-sigma modulator (CTDSM), and the first noise-shaped truncation output is a modulator output of the currently-sampled analog input.

6. The quantizer of claim 5, wherein a dynamic element matching (DEM) circuit and a feedback DAC are located at a feedback path of the CTDSM; the multi-bit ADC determines the MSB part and the LSB part sequentially; and the DEM circuit and the feedback DAC process the MSB part while the multi-bit ADC is determining the LSB part.

7. The quantizer of claim 1, wherein the multi-bit ADC further converts an earlier-sampled analog input into a second digital output; a second noise-shaped truncation output is derived from the second digital output; the first DAC feedback circuit further transfers a second truncation residue associated with the second noise-shaped truncation output to the internal DAC; the transferred second truncation residue is reflected in the comparison of the currently-sampled analog input of the multi-bit ADC via the internal DAC; a third noise-shaped truncation output is derived from the first noise-shaped truncation output; and the quantizer further comprises:
 a second DAC feedback circuit, configured to transfer a third truncation residue associated with the third noise-shaped truncation output to the internal DAC, wherein the transferred third truncation residue is reflected in the comparison of the later-sampled analog input of the multi-bit ADC via the internal DAC; and
 a first adder, configured to subtract a second truncation residue associated with the second noise-shaped truncation output from the third truncation residue to generate a fourth noise-shaped truncation output, wherein the third noise-shaped truncation output and the fourth noise-shaped truncation output are noise-shaped segmentation outputs of the currently-sampled analog input.

8. The quantizer of claim 7, wherein the first digital output of the multi-bit ADC comprises a most significant bit (MSB) part, a central significant bit (CSB) part and a least significant bit (LSB) part, the MSB part directly serves as the third noise-shaped truncation output, the CSB part directly serves as the third truncation residue, and the LSB part directly serves as the first truncation residue.

9. The quantizer of claim 7, wherein the quantizer is implemented in a continuous-time delta-sigma modulator (CTDSM), and the quantizer further comprises:
 a second adder, configured to:
  add the third noise-shaped truncation output to the fourth noise-shaped truncation output to generate a modulator output of the currently-sampled analog input; or
  subtract the transferred second truncation residue from the first digital output to generate the modulator output of the currently-sampled input.

10. The quantizer of claim 9, wherein a dynamic element matching (DEM) circuit and a feedback DAC are located at a feedback path of the CTDSM; the multi-bit ADC determines the MSB part, the CSB part and the LSB part sequentially; and the DEM circuit and the feedback DAC process the MSB part while the multi-bit ADC is determining the CSB part or the LSB part.

11. The quantizer of claim 7, further comprising:
 an excess loop delay (ELD) compensation circuit, configured to transfer an ELD compensation input to the internal DAC, wherein the ELD compensation input depends on the first digital output, and the transferred ELD compensation input is reflected in the comparison of the later-sampled analog input of the multi-bit ADC via the internal DAC.

12. The quantizer of claim 1, further comprising:
 an excess loop delay (ELD) compensation circuit, configured to transfer an ELD compensation input to the internal DAC, wherein the ELD compensation input depends on the first digital output, and the transferred ELD compensation input is reflected in the comparison of the later-sampled analog input of the multi-bit ADC via the internal DAC.

13. A quantizer comprising:
 a multi-bit analog-to-digital converter (ADC), having an internal digital-to-analog converter (DAC) associated with comparison of each sampled analog input of the multi-bit ADC, wherein the multi-bit ADC converts a currently-sampled analog input into a first digital output and further converts an earlier-sampled analog input into a second digital output, a first noise-shaped truncation output is derived from the first digital output, and a second noise-shaped truncation output is derived from the second digital output; and
 a DAC feedback circuit, configured to transfer a first truncation residue associated with the first noise-shaped truncation output to the internal DAC and further transfer a second truncation residue associated with the second noise-shaped truncation output to the internal DAC, wherein the transferred second truncation residue is reflected in comparison of the currently-sampled analog input of the multi-bit ADC via the internal DAC, and the transferred first truncation residue is reflected in comparison of a later-sampled analog input of the multi-bit ADC via the internal DAC; and
 a first adder, configured to subtract the second truncation residue from the first truncation residue to generate a third noise-shaped truncation output, wherein the first noise-shaped truncation output and the third noise-shaped truncation output are noise-shaped segmentation outputs of the currently-sampled analog input.

14. The quantizer of claim 13, wherein the multi-bit ADC is a successive approximation register (SAR) ADC.

15. The quantizer of claim 13, wherein the multi-bit ADC is a flash ADC.

16. The quantizer of claim 11, wherein the first digital output of the multi-bit ADC comprises a most significant bit (MSB) part and a least significant bit (LSB) part, the MSB part directly serves as the first noise-shaped truncation output, and the LSB part directly serves as the first truncation residue.

17. The quantizer of claim 13, wherein the quantizer is implemented in a continuous-time delta-sigma modulator (CTDSM), and the quantizer further comprises:

a second adder, configured to:
   add the first noise-shaped truncation output to the third noise-shaped truncation output to generate a modulator output of the currently-sampled analog input; or
   subtract the transferred second truncation residue from the first digital output to generate the modulator output of the currently-sampled input.

18. The quantizer of claim 17, wherein a dynamic element matching (DEM) circuit and a feedback DAC are located at a feedback path of the CTDSM; the multi-bit ADC determines the MSB part and the LSB part sequentially; and the DEM circuit and the feedback DAC process the MSB part while the multi-bit ADC is determining the LSB part.

19. The quantizer of claim 13, further comprising:
an excess loop delay (ELD) compensation circuit, configured to transfer an ELD compensation input to the internal DAC, wherein the ELD compensation input depends on the first digital output, and the transferred ELD compensation input is reflected in the comparison of the later-sampled analog input of the multi-bit ADC via the internal DAC.

\* \* \* \* \*